(12) United States Patent
Ohno et al.

(10) Patent No.: US 9,925,749 B2
(45) Date of Patent: Mar. 27, 2018

(54) BONDING APPARATUS AND STACK BODY MANUFACTURING APPARATUS

(71) Applicant: Semiconductor Energy Laboratory Co., Ltd., Atsugi-shi, Kanagawa-ken (JP)

(72) Inventors: Masakatsu Ohno, Utsunomiya (JP); Yoshiharu Hirakata, Ebina (JP); Shingo Eguchi, Atsugi (JP); Yasuhiro Jinbo, Isehara (JP); Hisao Ikeda, Zama (JP); Kohei Yokoyama, Fujisawa (JP); Hiroki Adachi, Tochigi (JP); Satoru Idojiri, Tochigi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 126 days.

(21) Appl. No.: 14/468,818

(22) Filed: Aug. 26, 2014

(65) Prior Publication Data
US 2015/0068683 A1    Mar. 12, 2015

(30) Foreign Application Priority Data

Sep. 6, 2013 (JP) .................................. 2013-184659
Feb. 19, 2014 (JP) .................................. 2014-029754

(51) Int. Cl.
*B32B 37/00* (2006.01)
*B32B 37/12* (2006.01)
(Continued)

(52) U.S. Cl.
CPC .... *B32B 37/0046* (2013.01); *B32B 17/10431* (2013.01); *B32B 27/08* (2013.01);
(Continued)

(58) Field of Classification Search
CPC .......... B32B 37/0046; B32B 2264/105; B32B 38/18; B32B 17/10431; B32B 37/0015;
(Continued)

(56) References Cited

U.S. PATENT DOCUMENTS 6,127,199 A    10/2000  Inoue et al.
6,372,608 B1    4/2002  Shimoda et al.
(Continued)

FOREIGN PATENT DOCUMENTS

CN    001282066 A    1/2001
CN    001708853 A    12/2005
(Continued)

OTHER PUBLICATIONS

Yamazaki Shunpei; Machine translation of JP 2011-53503; Mar. 17, 2011.*
(Continued)

*Primary Examiner* — Vishal I Patel
(74) *Attorney, Agent, or Firm* — Robinson Intellectual Property Law Office; Eric J. Robinson

(57) ABSTRACT

A yield in the step of bonding two members together is improved. A bonding apparatus includes a stage capable of supporting a first member having a sheet-like shape, a fixing mechanism capable of fixing one end portion of a second member having a sheet-like shape so that the second member overlaps with the first member, and a pressurizing mechanism capable of moving from a side of the one end portion of the second member to a side of the other end portion and spreading a bonding layer under pressure between the first member and the second member. The first member and the second member are bonded to each other.

11 Claims, 24 Drawing Sheets

(51) Int. Cl.
  *B32B 38/18* (2006.01)
  *B32B 17/10* (2006.01)
  *B32B 27/08* (2006.01)
  *B32B 27/20* (2006.01)
  *B32B 27/36* (2006.01)
  *B32B 38/00* (2006.01)

(52) U.S. Cl.
  CPC .............. *B32B 27/20* (2013.01); *B32B 27/36* (2013.01); *B32B 37/1284* (2013.01); *B32B 38/18* (2013.01); *B32B 38/1841* (2013.01); B32B 37/003 (2013.01); B32B 37/0015 (2013.01); B32B 38/0008 (2013.01); B32B 38/1858 (2013.01); B32B 2264/102 (2013.01); B32B 2264/105 (2013.01); B32B 2309/68 (2013.01); B32B 2457/14 (2013.01); B32B 2457/20 (2013.01); *H01L 2224/01* (2013.01); *Y10T 156/15* (2015.01); *Y10T 156/1798* (2015.01)

(58) Field of Classification Search
  CPC .............. B32B 37/003; B32B 38/0008; B32B 38/1841; B32B 38/1858; B32B 2309/68; B32B 2457/14; B32B 2457/20; B32B 27/36; B32B 2264/102; B32B 37/1284; B32B 27/08; B32B 27/20; H01L 2224/01; Y10T 156/15; Y10T 156/1798
  See application file for complete search history.

(56) References Cited

U.S. PATENT DOCUMENTS

| 7,045,438 | B2 | 5/2006 | Yamazaki et al. |
| 7,189,631 | B2 | 3/2007 | Yamazaki et al. |
| 7,547,612 | B2 | 6/2009 | Yamazaki et al. |
| 7,554,121 | B2 | 6/2009 | Hirakata et al. |
| 7,923,348 | B2 | 4/2011 | Yamazaki et al. |
| 8,012,854 | B2 | 9/2011 | Yamazaki et al. |
| 8,040,469 | B2 | 10/2011 | Nakamura et al. |
| 8,173,520 | B2 | 5/2012 | Yamazaki et al. |
| 8,415,208 | B2 | 4/2013 | Takayama et al. |
| 8,415,679 | B2 | 4/2013 | Yamazaki et al. |
| 2004/0232413 | A1 | 11/2004 | Yamazaki et al. |
| 2013/0214434 | A1 | 8/2013 | Yamazaki et al. |
| 2015/0059986 | A1 | 3/2015 | Komatsu et al. |
| 2015/0059987 | A1 | 3/2015 | Kumakura et al. |
| 2015/0060933 | A1 | 3/2015 | Ohno et al. |

FOREIGN PATENT DOCUMENTS

| EP | 1072931 A | 1/2001 |
| JP | 08-078366 A | 3/1996 |
| JP | H10-125931 A | 5/1998 |
| JP | 2001-042351 A | 2/2001 |
| JP | 2002-341323 A | 11/2002 |
| JP | 2003-174153 A | 6/2003 |
| JP | 2011-053503 A | 3/2011 |
| JP | 4693411 | 6/2011 |
| KR | 2001-0015442 A | 2/2001 |
| KR | 2005-0059259 A | 6/2005 |
| KR | 2011-0025039 A | 3/2011 |
| TW | I316753 | 11/2009 |
| TW | 201117947 | 6/2011 |
| WO | WO-2004/040648 | 5/2004 |

OTHER PUBLICATIONS

Ueda Masahide; Machine translation of JP 2002-341323.*
Machine translation of JP 2011-53503 A.*
International Search Report (Application No. PCT/JP2014/073117) dated Nov. 25, 2014.
Written Opinion (Application No. PCT/JP2014/073117) dated Nov. 25, 2014.

* cited by examiner

BONDING APPARATUS AND STACK BODY MANUFACTURING APPARATUS

TECHNICAL FIELD

The present invention relates to an object, a method, or a manufacturing method. In addition, the present invention relates to a process, a machine, manufacture, or a composition of matter. One embodiment of the present invention relates to a semiconductor device, a display device, a light-emitting device, a lighting device, an electronic device, a driving method thereof, a manufacturing method thereof, or a manufacturing apparatus thereof. One embodiment of the present invention particularly relates to a bonding apparatus and a stack body manufacturing apparatus. One embodiment of the present invention also relates to a bonding method and a stack body manufacturing method.

BACKGROUND ART

In recent years, a flexible device in which a functional element such as a semiconductor element, a display element, or a light-emitting element is provided over a substrate having flexibility (hereinafter also referred to as a flexible substrate) has been developed. Typical examples of the flexible device include a lighting device, an image display device, a variety of semiconductor circuits including a semiconductor element such as a transistor, and the like.

As a method for manufacturing a device including a flexible substrate, a technique has been developed in which a functional element such as a thin film transistor or an organic EL element is formed over a formation substrate (e.g., a glass substrate or a quartz substrate), and then the functional element is transferred to a flexible substrate. This technique needs a step of separating a layer including the functional element from the formation substrate (also referred to as a separation step).

For example, Patent Document 1 discloses the following separation technique using laser ablation: a separation layer formed of amorphous silicon or the like is provided over a substrate, a layer to be separated which includes a thin film element is provided over the separation layer, and the layer to be separated is bonded to a transfer body with the use of a bonding layer. The separation layer is ablated by laser light irradiation, so that separation is caused at the separation layer.

In addition, Patent Document 2 discloses a technique in which separation is conducted by physical force with human hands or the like. In addition, Patent Document 2 discloses the following separation technique: a metal layer is formed between a substrate and an oxide layer and separation is caused at the interface between the oxide layer and the metal layer by utilizing weak bonding at the interface between the oxide layer and the metal layer, so that a layer to be separated and the substrate are separated from each other.

Patent Documents

[Patent Document 1] Japanese Published Patent Application No. H10-125931
[Patent Document 2] Japanese Published Patent Application No. 2003-174153

DISCLOSURE OF INVENTION

After the separation step mentioned above, a flexible substrate is bonded using a bonding layer to the layer separated from the formation substrate (this step is also referred to as a bonding step). Accordingly, the layer to be separated can be transferred to the flexible substrate.

In bonding the separated layer and the flexible substrate together, there may occur problems such as inclusion of bubbles between the separated layer and the flexible substrate (in the bonding layer), thickness unevenness of the bonding layer, and misalignment between the separated layer and the flexible substrate. Such problems may lead to a decrease in device reliability and cause a decrease in display quality in the case of a display device, for example.

An object of one embodiment of the present invention is to improve a yield in the step of bonding two members together.

An object of one embodiment of the present invention is to improve a yield in the process of manufacturing a device such as a semiconductor device, a light-emitting device, a display device, an electronic device, or a lighting device. In particular, an object is to improve a yield in the process of manufacturing a lightweight, thin, or flexible semiconductor device, light-emitting device, display device, electronic device, or lighting device.

An object of one embodiment of the present invention is to provide a novel bonding apparatus or a novel stack body manufacturing apparatus.

An object of one embodiment of the present invention is to improve alignment accuracy at the time of bonding substrates in the process of manufacturing a device. An object of one embodiment of the present invention is to provide a highly reliable light-emitting device.

Note that in one embodiment of the present invention, there is no need to achieve all the objects.

A bonding apparatus in one embodiment of the present invention includes a stage capable of supporting a first member having a sheet-like shape, a fixing mechanism capable of fixing one end portion of a second member having a sheet-like shape so that the second member overlaps with the first member, and a pressurizing mechanism capable of moving from a side of the one end portion of the second member to a side of the other end portion and spreading a bonding layer under pressure between the first member and the second member. The first member and the second member can be bonded to each other.

The bonding apparatus having the above structure preferably includes a bonding layer formation mechanism capable of forming the bonding layer over the first member supported by the stage.

The bonding apparatus having the above structure preferably includes a member holding mechanism configured to hold the other end portion of the second member so as to prevent the other end portion of the second member from being bonded to the first member before the first member and the second member are bonded to each other using the pressurizing mechanism.

In the bonding apparatus having the above structure, the fixing mechanism is preferably configured to fix the end portion of the second member which extends beyond the end portion of the first member.

In the bonding apparatus having the above structure, the fixing mechanism is preferably configured to fix the second member so that the difference in height between a region of the second member which overlaps with the fixing mechanism and a region of the second member which overlaps with the bonding layer (or the first member) becomes smaller than the sum of thicknesses of the first member and the bonding layer.

An embodiment of the present invention is a stack body manufacturing apparatus which includes a first supply unit configured to supply a process member having a sheet-like shape, a first separation unit configured to be supplied with the process member and separate the process member into one surface layer and a first remaining portion, a support body supply unit configured to supply a first support body having a sheet-like shape, a first bonding unit configured to be supplied with the first remaining portion and the first support body and bond the first remaining portion and the first support body to each other with a first bonding layer, and a first unloading unit configured to unload a first stack body including the first remaining portion, the first bonding layer, and the first support body. The first bonding unit includes a first bonding apparatus. The first bonding apparatus includes a first stage capable of supporting the first remaining portion, a first fixing mechanism capable of fixing one end portion of the first support body so that the first support body overlaps with the first remaining portion, and a first pressurizing mechanism capable of moving from a side of the one end portion of the first support body to a side of the other end portion and spreading the first bonding layer under pressure between the first remaining portion and the first support body.

An embodiment of the present invention is a stack body manufacturing apparatus which includes a first supply unit configured to supply a process member having a sheet-like shape, a first separation unit configured to be supplied with the process member and separate the process member into one surface layer and a first remaining portion, a support body supply unit configured to supply a first support body and a second support body each having a sheet-like shape, a first bonding unit configured to be supplied with the first remaining portion and the first support body and bond the first remaining portion and the first support body to each other with a first bonding layer, a first unloading unit configured to unload a first stack body including the first remaining portion, the first bonding layer, and the first support body, a second supply unit configured to supply the first stack body, a trigger formation unit configured to be supplied with the first stack body and form a separation trigger near an end portion of the first remaining portion, a second separation unit configured to be supplied with the first stack body including the separation trigger and separate the first stack body into one surface layer and a second remaining portion, a second bonding unit configured to be supplied with the second remaining portion and the second support body and bond the second remaining portion and the second support body to each other with a second bonding layer, and a second unloading unit configured to unload a second stack body including the second remaining portion, the second bonding layer, and the second support body. The first bonding unit includes a first bonding apparatus. The first bonding apparatus includes a first stage capable of supporting the first remaining portion, a first fixing mechanism capable of fixing one end portion of the first support body so that the first support body overlaps with the first remaining portion, and a first pressurizing mechanism capable of moving from a side of the one end portion of the first support body to a side of the other end portion and spreading the first bonding layer under pressure between the first remaining portion and the first support body.

In the stack body manufacturing apparatus having the above structure, the first bonding apparatus preferably includes a first bonding layer formation mechanism capable of forming the first bonding layer over the first remaining portion supported by the first stage.

In the stack body manufacturing apparatus having the above structure, the first bonding apparatus preferably includes a first member holding mechanism configured to hold the other end portion of the first support body so as to prevent the other end portion of the first support body from being bonded to the first remaining portion before the first remaining portion and the first support body are bonded to each other using the first pressurizing mechanism.

In the stack body manufacturing apparatus having the above structure, the first fixing mechanism is preferably configured to fix the end portion of the first support body which extends beyond the end portion of the first remaining portion.

In the stack body manufacturing apparatus having the above structure, the first fixing mechanism is preferably configured to fix the first support body so that the difference in height between a region of the first support body which overlaps with the first fixing mechanism and a region of the first support body which overlaps with the first bonding layer (or the first remaining portion) becomes smaller than the sum of thicknesses of the first remaining portion and the first bonding layer.

In the stack body manufacturing apparatus having the above structure, the second bonding unit preferably includes a second bonding apparatus. The second bonding apparatus preferably includes a second stage capable of supporting the second remaining portion, a second fixing mechanism capable of fixing one end portion of the second support body so that the second support body overlaps with the second remaining portion, and a second pressurizing mechanism capable of moving from a side of the one end portion of the second support body to a side of the other end portion and spreading the second bonding layer under pressure between the second remaining portion and the second support body.

In the stack body manufacturing apparatus having the above structure, the second bonding apparatus preferably includes a second bonding layer formation mechanism capable of forming the second bonding layer over the second remaining portion supported by the second stage.

In the stack body manufacturing apparatus having the above structure, the second bonding apparatus preferably includes a second member holding mechanism configured to hold the other end portion of the second support body so as to prevent the other end portion of the second support body from being bonded to the second remaining portion before the second remaining portion and the second support body are bonded to each other using the second pressurizing mechanism.

In the stack body manufacturing apparatus having the above structure, the second fixing mechanism is preferably configured to fix the end portion of the second support body which extends beyond the end portion of the second remaining portion.

In the stack body manufacturing apparatus having the above structure, the second fixing mechanism is preferably configured to fix the second support body so that the difference in height between a region of the second support body which overlaps with the second fixing mechanism and a region of the second support body which overlaps with the second bonding layer (or the second remaining portion) becomes smaller than the sum of thicknesses of the second remaining portion and the second bonding layer.

An embodiment of the present invention is a stack body manufacturing apparatus which includes a first supply unit configured to supply a process member having a sheet-like shape, a first separation unit configured to be supplied with the process member and separate the process member into one surface layer and a first remaining portion, a support body supply unit configured to supply a first support body and a second support body each having a sheet-like shape, a first bonding unit configured to be supplied with the first remaining portion and the first support body and bond the first remaining portion and the first support body to each other with a first bonding layer, a first unloading unit configured to unload a first stack body including the first remaining portion, the first bonding layer, and the first support body, a second supply unit configured to supply the first stack body, a trigger formation unit configured to be supplied with the first stack body and form a separation trigger near an end portion of the first remaining portion, a second separation unit configured to be supplied with the first stack body including the separation trigger and separate the first stack body into one surface layer and a second remaining portion, a second bonding unit configured to be supplied with the second remaining portion and the second support body and bond the second remaining portion and the second support body to each other with a second bonding layer, and a second unloading unit configured to unload a second stack body including the second remaining portion, the second bonding layer, and the second support body. The second bonding unit includes a second bonding apparatus. The second bonding apparatus includes a second stage capable of supporting the second remaining portion, a second fixing mechanism capable of fixing one end portion of the second support body so that the second support body overlaps with the second remaining portion, and a second pressurizing mechanism capable of moving from a side of the one end portion of the second support body to a side of the other end portion and spreading the second bonding layer under pressure between the second remaining portion and the second support body.

One embodiment of the present invention can improve a yield in the step of bonding two members together. Note that one embodiment of the present invention is not limited to this effect. For example, depending on circumstances or conditions, one embodiment of the present invention might not produce this effect and might produce another effect (such as another effect described in this specification). Alternatively, one embodiment of the present invention might produce this effect and also another effect (such as another effect described in this specification).

BEST MODE FOR CARRYING OUT THE INVENTION

Figure 1A:
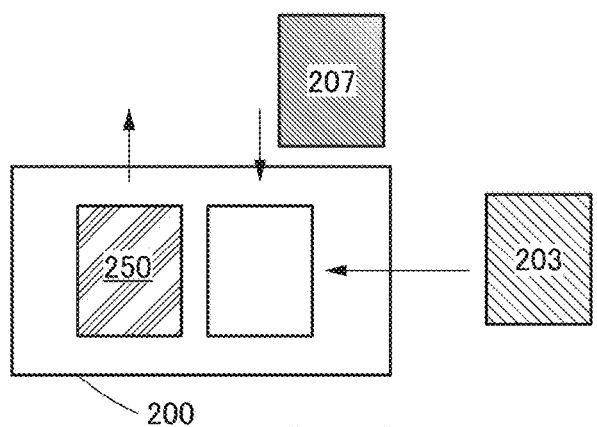
FIGS. 1A to 1G illustrate a bonding apparatus and a bonding method.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatch pattern is applied to similar functions, and these are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, size, range, or the like disclosed in the drawings and the like.

A layer to be separated can be formed over a formation substrate, separated from the formation substrate, and then transferred to another substrate. With this method, for example, a layer to be separated which is formed over a formation substrate having high heat resistance can be transferred to a substrate having low heat resistance. The temperature at which the layer to be separated is formed is not limited by the substrate having low heat resistance. The layer to be separated is transferred to a substrate or the like which is more lightweight, thin, or flexible than the formation substrate, whereby a variety of devices such as a semiconductor device, a light-emitting device, or a display device can be made lightweight, thin, and flexible.

Furthermore, electronic devices including the variety of devices, such as television devices, monitors for computers, cameras such as digital cameras and digital video cameras, digital photo frames, cellular phones, portable game machines, portable information terminals, and audio reproducing devices, can be made lightweight, thin, and flexible.

A device that can be manufactured according to one embodiment of the present invention includes a functional element. Examples of the functional element include a semiconductor element such as a transistor; a light-emitting diode; a light-emitting element such as an inorganic EL element and an organic EL element; and a display element such as a liquid crystal element. For example, a semiconductor device including a sealed transistor and a light-emitting device including a sealed light-emitting element (here, a display device including a transistor and a light-emitting element which are sealed is also included) are also examples of the device that can be manufactured according to one embodiment of the present invention.

As a specific example, since an organic EL element is likely to deteriorate due to moisture or the like, it is preferable that a protective film having an excellent moisture-proof property be formed over a glass substrate at a high temperature and transferred to a flexible organic resin substrate having low heat resistance and a poor moisture-proof property. A highly reliable flexible light-emitting device can be manufactured by forming an organic EL element over the protective film transferred to the organic resin substrate.

As another example, a protective film having an excellent moisture-proof property may be formed over a glass substrate at a high temperature, and an organic EL element may be formed over the protective film. After that, the protective film and the organic EL element may be separated from the glass substrate and transferred to a flexible organic resin substrate having low heat resistance and a poor moisture-proof property. A highly reliable flexible light-emitting device can be manufactured by transferring the protective film and the organic EL element to the organic resin substrate.

One embodiment of the present invention relates to an apparatus for manufacturing a device (or a stack body included in the device) by performing such separation and transfer.

A stack body manufacturing apparatus in one embodiment of the present invention includes a supply unit for supplying a process member, a separation unit for separating the process member into a surface layer and a remaining portion, a bonding unit for bonding a support body to the remaining portion, a support body supply unit for supplying the support body, and an unloading unit for unloading a stack body including the remaining portion and the support body bonded to each other with a bonding layer.

Thus, one surface layer of a process member can be separated, and a support body can be bonded to a remaining portion of the process member from which the surface layer has been separated. One embodiment of the present invention can provide a novel stack body manufacturing apparatus capable of manufacturing a stack body including a support body and a remaining portion of a process member from which a surface layer has been separated.

In Embodiment 1, a bonding apparatus in one embodiment of the present invention will be described. In Embodiments 2 and 3, a stack body manufacturing apparatus in one embodiment of the present invention which includes the bonding apparatus will be described. In Embodiment 4, a process member which can be used in the stack body manufacturing apparatus in one embodiment of the present invention will be described. In Embodiment 5, a stack body which can be manufactured with the stack body manufacturing apparatus in one embodiment of the present invention, and a flexible light-emitting device which is one example of a device including the stack body will be described.

Embodiment 1

In this embodiment, a bonding apparatus in one embodiment of the present invention will be described with reference to drawings.

One embodiment of the present invention relates to a method for manufacturing a stack body in which a first member, a bonding layer, and a second member are stacked in this order.

Figure 5A:
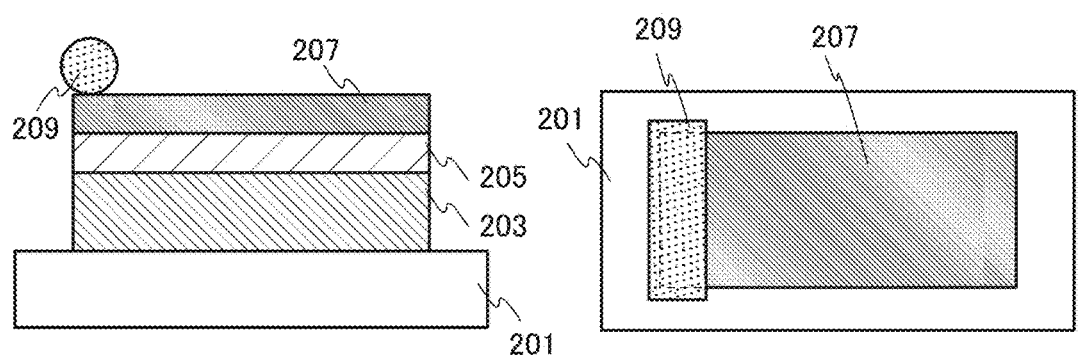
FIGS. 5A and 5B illustrate a comparative example of a bonding method.

For example, as illustrated in a plan view and a cross-sectional view in FIG. 5A, a first member 203, a bonding layer 205, and a second member 207 are stacked over a stage 201. Then, a roller that is a pressurizing mechanism 209 is moved over the second member 207 to apply pressure to the bonding layer 205 and the second member 207.

Figure 5B:
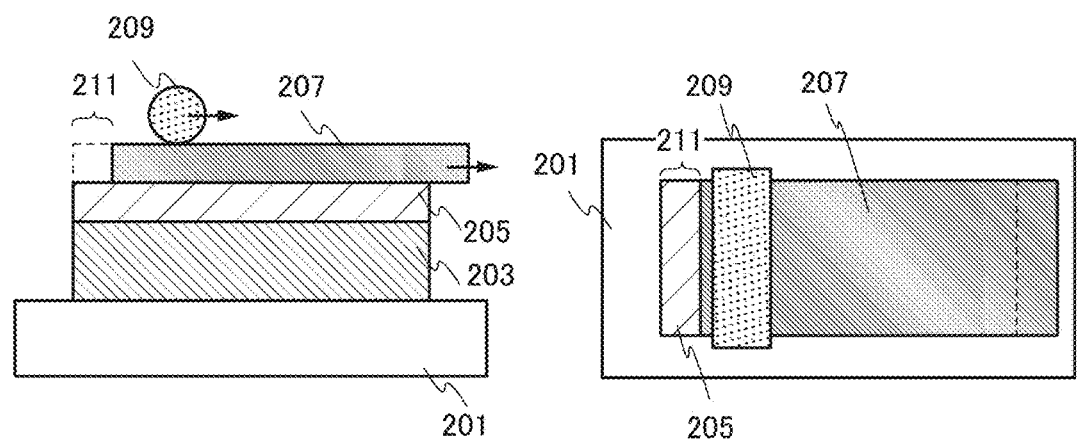

As illustrated in a plan view and a cross-sectional view in FIG. 5B, the second member 207 may also be moved in the direction of movement of the pressurizing mechanism 209, and the position of the second member 207 relative to the first member 203 may be changed.

The displacement of the second member 207 relative to the first member 203 causes problems such as thickness unevenness of the bonding layer 205, formation of wrinkles in the second member 207, and failure to bond the second member 207 to the entire area of the first member 203. In other words, the displacement causes a yield decrease in manufacturing a stack body.

Here, the bonding apparatus in one embodiment of the present invention includes a stage capable of supporting a first member having a sheet-like shape, a fixing mechanism capable of fixing one end portion of a second member having a sheet-like shape so that the second member overlaps with the first member, and a pressurizing mechanism capable of moving from a side of the one end portion of the second member to a side of the other end portion and spreading a bonding layer under pressure between the first member and the second member. The first member and the second member are bonded to each other.

With the bonding apparatus having the above structure, a stack body can be manufactured. The use of the pressurizing mechanism can reduce thickness unevenness of a bonding layer and inclusion of bubbles in the stack body.

In the bonding apparatus having the above structure, in a state where the fixing mechanism fixes the one end portion of the second member to fix the position of the second member relative to the first member, the pressurizing mechanism can move from a side of the one end portion of the second member to a side of the other end portion. This can suppress displacement of the second member relative to the first member due to pressure application. This is particularly useful in the case where the bonding layer has low adhesion.

Note that the bonding apparatus may be placed in an air atmosphere or in a reduced-pressure atmosphere. A reduced-pressure atmosphere is preferable because it is possible to suppress inclusion of bubbles in the stack body.

FIG. 1A illustrates a bonding apparatus 200. The first member 203 having a sheet-like shape and the second member 207 having a sheet-like shape are supplied to the bonding apparatus 200. The bonding apparatus 200 supplies a stack body 250 in which the first member 203 and the second member 207 are bonded to each other with the bonding layer 205.

The first member 203 and the second member 207 may each have a single-layer structure or a stacked-layer structure. A material capable of bonding the first member 203 and the second member 207 to each other is used for the bonding layer 205.

Examples of structures and operations of the bonding apparatus 200 and bonding methods using the bonding apparatus 200 will be described below.

Structural Example 1

Figure 1B:
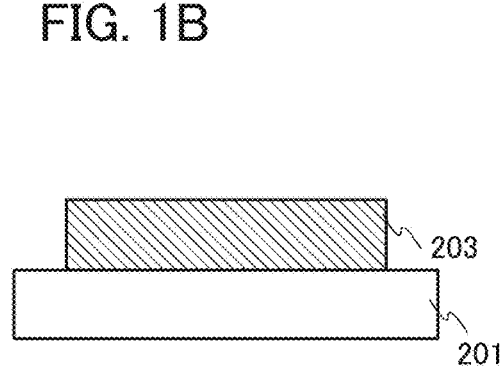

First, the first member 203 is supplied to the bonding apparatus 200. The first member 203 is placed over a stage 201 (FIG. 1B). Note that in the case where a transport mechanism is provided in the bonding apparatus 200, the first member 203 may be transported by the transport mechanism.

The stage 201 may be movable back and forth, from side to side, or up and down. Examples of fixing mechanisms for fixing a member or the like placed over the stage 201 include chucks such as a suction chuck, an electrostatic chuck, and a mechanical chuck. For example, a porous chuck may be used. Alternatively, a member may be fixed to a suction table, a heater table, a spinner table, or the like.

Figure 1C:
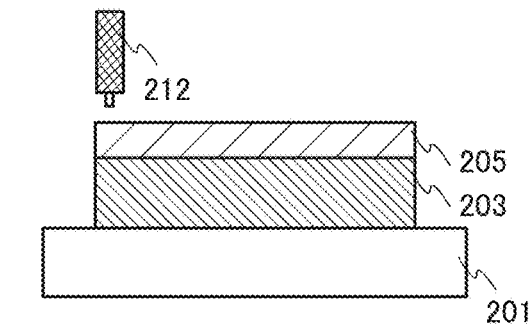

Next, a bonding layer formation mechanism 212 forms the bonding layer 205 over the first member 203 (FIG. 1C).

A method for manufacturing the bonding layer 205 is not particularly limited, and for example, a droplet discharge method, a printing method (such as a screen printing method or an offset printing method), a coating method such as a spin coating method or a spray coating method, a dipping method, a dispensing method, a nanoimprint method, or the like can be used as appropriate. Alternatively, a bonding sheet formed in a sheet-like shape may be bonded to the first member 203 under pressure.

The bonding layer formation mechanism 212 is not particularly limited, and for example, a printing apparatus, a dispensing apparatus, a coating apparatus, an inkjet apparatus, a spin coater, a spray coating apparatus, a bar coater, a slit coater, or the like can be used. Alternatively, an apparatus for supplying a bonding sheet formed in a sheet-like shape in advance may be used.

The bonding layer 205 may be formed over the entire surface of the first member 203 or may be formed into a pattern such as stripes.

Figure 23A:
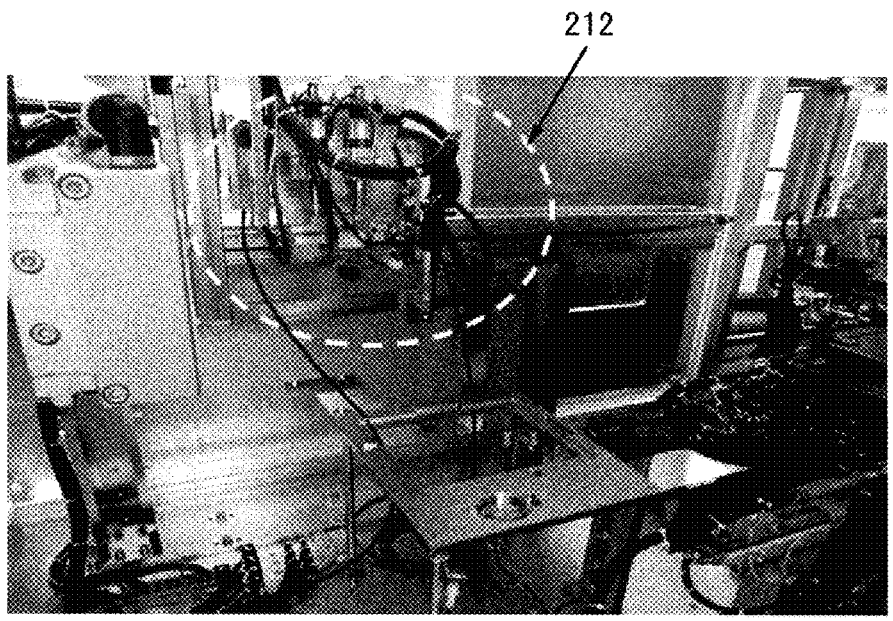
FIGS. 23A and 23B are photographs showing a bonding layer formation mechanism and a pressurizing mechanism.

FIG. 23A shows a bonding apparatus in one embodiment of the present invention which includes a dispensing apparatus as one example of the bonding layer formation mechanism 212.

The bonding apparatus in one embodiment of the present invention does not necessarily include the bonding layer formation mechanism. For example, the bonding layer may be provided over the first member or the second member in advance, and the first member or the second member provided with the bonding layer may be supplied to the bonding apparatus.

Figure 1D:
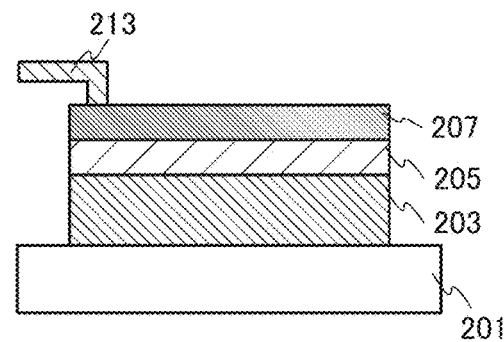

Next, the second member 207 is placed over the bonding layer 205 so as to overlap with the first member 203. Then, a fixing mechanism 213 fixes one end portion of the second member 207 (FIG. 1D). Note that in the case where the transport mechanism is provided in the bonding apparatus 200, the second member 207 may be transported by the transport mechanism.

Examples of the fixing mechanism 213 include chucks such as a suction chuck, an electrostatic chuck, and a mechanical chuck. FIG. 1D illustrates an example of using a mechanical chuck.

Next, a pressurizing mechanism 209 moves from a side of the one end portion of the second member 207 to a side of the other end portion (from side to side) and spreads the bonding layer 205 under pressure (FIGS. 1E to 1G and FIG. 24A).

By bonding the first member 203 and the second member 207 to each other while applying pressure to the bonding layer 205, inclusion of bubbles between the first member 203 and the second member 207 can be suppressed. In addition, thickness unevenness of the bonding layer 205 can be reduced.

Applying pressure while fixing the second member 207 using the fixing mechanism 213 can suppress the displacement of the second member 207 relative to the first member 203 due to pressure application.

In the case where the bonding layer 205 is in a fluid state such as an uncured state or a semi-cured state at the time of pressure application, inclusion of bubbles or variation in thickness can be further suppressed. Alternatively, the bonding layer 205 may have adhesiveness (stickiness) at the time of pressure application or may exhibit adhesiveness after pressure application.

It is preferable that a material of the bonding layer 205 not adhere to the stage 201 or the like by spreading beyond end portions of the first member 203 and the second member 207. Such adhesion can be prevented by adjusting the pattern of the bonding layer 205 or the amount of the material of the bonding layer 205 as appropriate. Furthermore, the bonding apparatus may include a mechanism for removing the material of the bonding layer 205 which adheres to the stage 201 or the like. For example, an organic solvent such as acetone or a wiper such as cloth may be used.

As the pressurizing mechanism 209, a roller or a flat plate can be used. One roller or flat plate may be used, or a plurality of rollers or flat plates may be used. Examples of materials of the roller include stainless steel and resins.

Figure 23B:
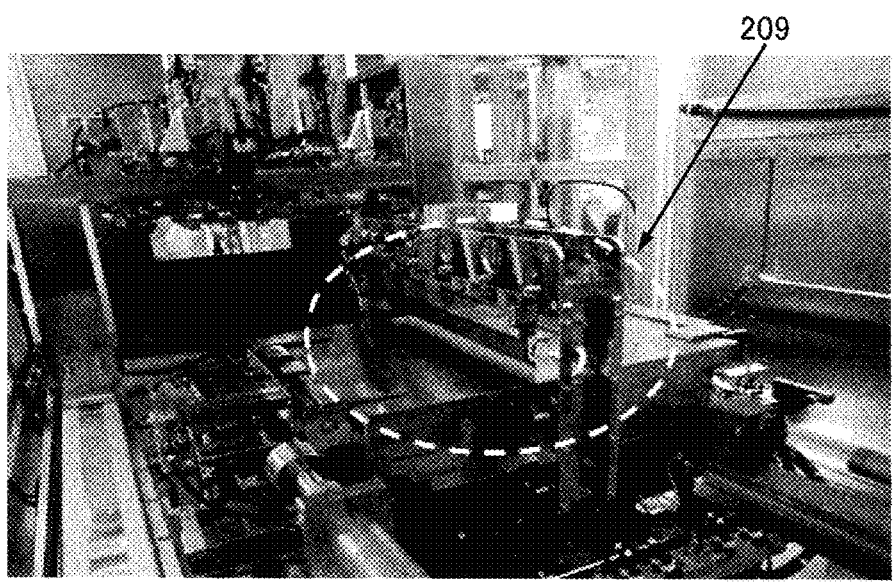
Figure 24A:
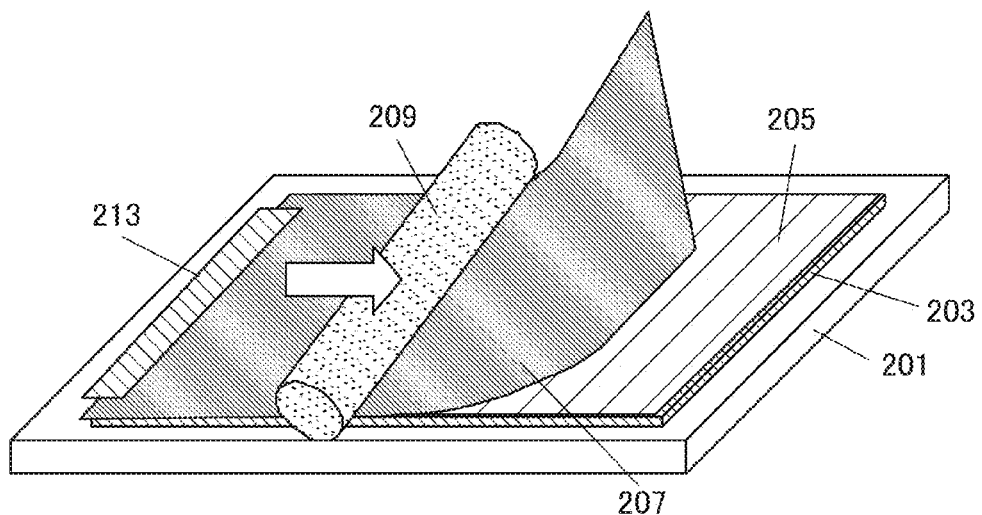
FIGS. 24A and 24B illustrate a bonding apparatus and a bonding method.
Figure 24B:
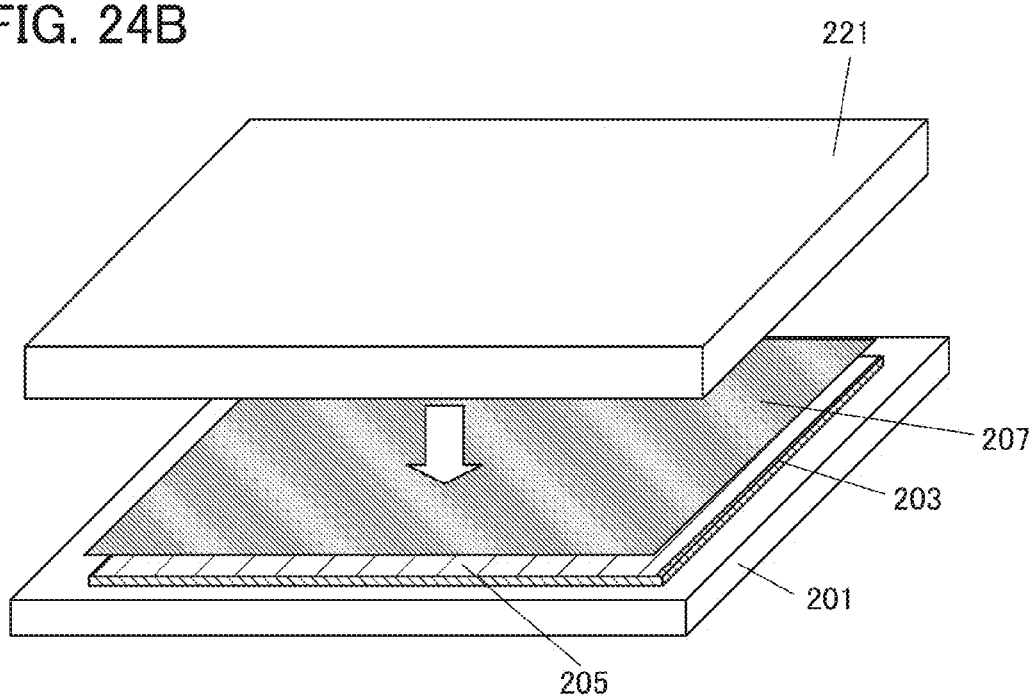

FIG. 23B shows a bonding apparatus in one embodiment of the present invention which includes a roller as an example of the pressurizing mechanism 209.

The bonding apparatus in one embodiment of the present invention may include a corona discharge ionizer, a soft X-ray ionizer, an ultraviolet ionizer, or the like so that static electricity is not generated at the time of pressure application. Furthermore, a conductive material such as a metal may be used for the stage. Moreover, a conductive material may be used for a protective film for the second member 207 to be in contact with the roller.

In the above-described manner, the first member and the second member are bonded to each other using the bonding apparatus in one embodiment of the present invention, whereby the stack body 250 in which the first member 203, the bonding layer 205, and the second member 207 are stacked in this order can be manufactured.

Figure 1E:
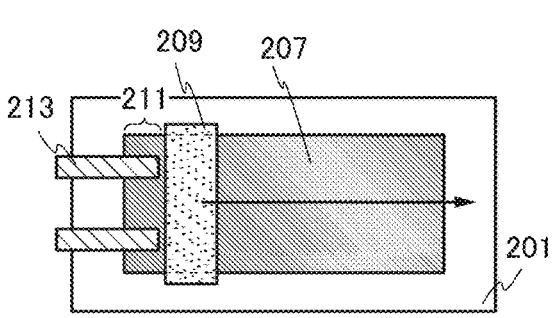
Figure 1F:
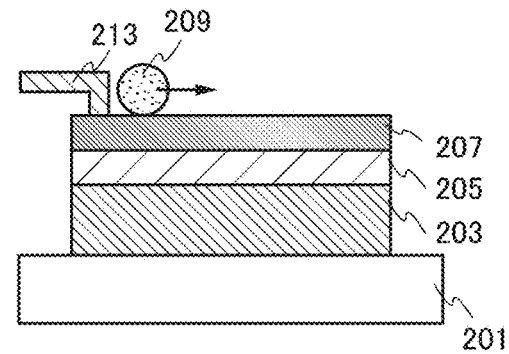
Figure 1G:
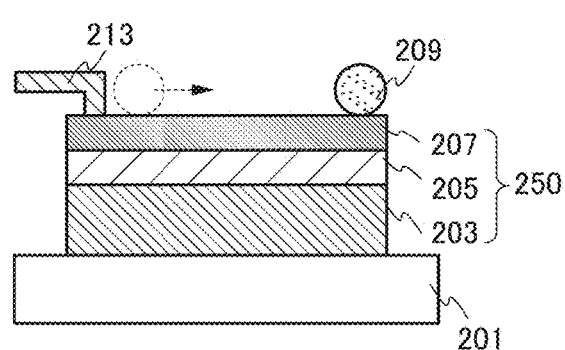
Figure 17A:
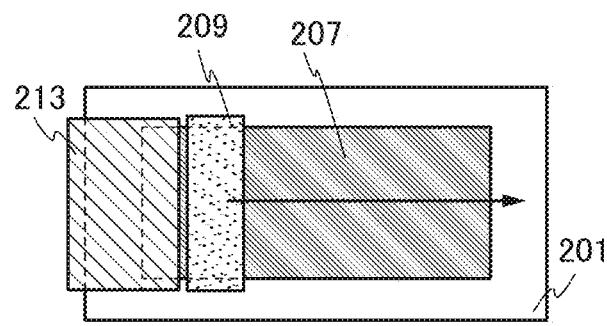
FIGS. 17A and 17B illustrate a bonding apparatus and a bonding method.

Note that FIG. 1E illustrates an example of the fixing mechanism 213 whose width is smaller than that of the second member 207; however, the present invention is not limited to this example, and a fixing mechanism whose width is larger than or equal to that of the second member 207 may be used. FIG. 17A illustrates the case of using the fixing mechanism 213 whose width is larger than that of the second member 207.

Figure 18A:
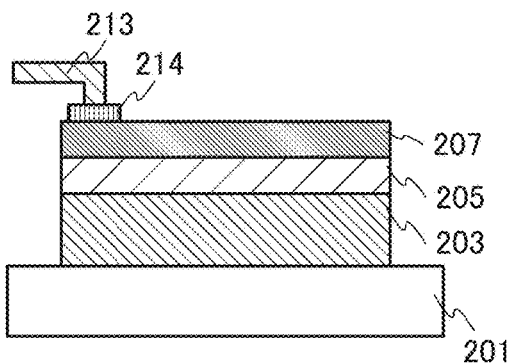
FIGS. 18A to 18D illustrate a bonding apparatus and a bonding method.
Figure 18B:
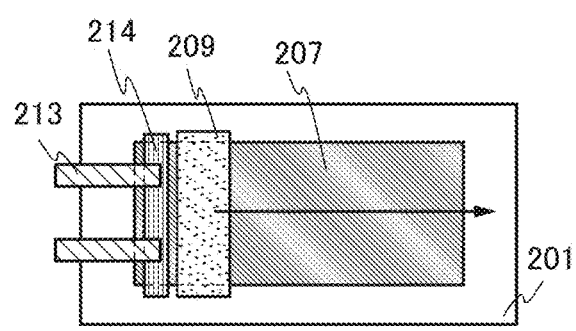

As illustrated in FIGS. 18A and 18B, a fixing mechanism 214 may be provided between the fixing mechanism 213 and the second member 207. The fixing mechanism 214 has a function of equalizing a force applied by the fixing mechanism 213 to the second member 207. Examples of the fixing mechanism 214 include a metal plate, an organic resin plate of acrylic, plastic, or the like, a glass plate, and the like. Alternatively, an elastic material or object such as rubber, a resin, or a spring can be used for the fixing mechanism 214. In that case, it is possible to reduce damage due to a concentrated force applied to part of the second member 207. Note that even in the case where the fixing mechanism 214 is used, the width of the fixing mechanism is not limited, and a fixing mechanism whose width is larger than or equal to that of the second member 207 may be used.

Structural Example 2

In the structural example 1, the first member 203 and the second member 207 may be bonded to each other before pressure application depending on the adhesiveness (stickiness) of the bonding layer 205. Once the members are bonded to each other, it is difficult to completely remove bubbles from a stack body by pressure application.

Figure 2A:
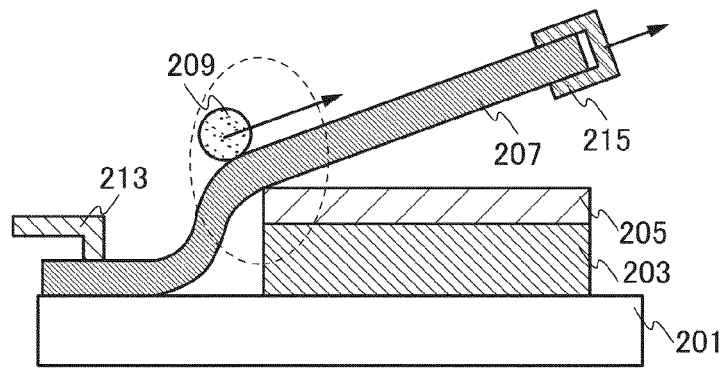
FIGS. 2A to 2D illustrate a bonding apparatus and a bonding method.

Thus, as illustrated in FIG. 2A, the bonding apparatus preferably includes a member holding mechanism 215 configured to hold the other end portion of the second member 207 so as to prevent the other end portion of the second member 207 from being bonded to the first member 203 before the first member 203 and the second member 207 are bonded to each other using the pressurizing mechanism 209.

In addition, in the structural example 1, as illustrated in a region 211 in FIG. 1E, a region to which pressure is not sufficiently applied by the pressurizing mechanism 209 is generated near the end portion of the second member 207 fixed by the fixing mechanism 213. In the region 211 of a manufactured stack body, there may occur problems such as thickness unevenness of the bonding layer 205 and inclusion of bubbles in the stack body.

Figure 2B:
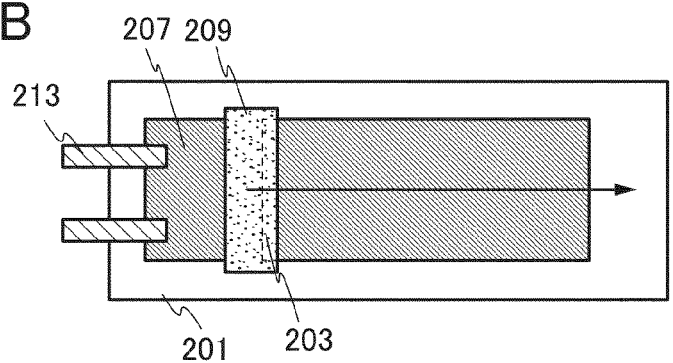
Figure 2C:
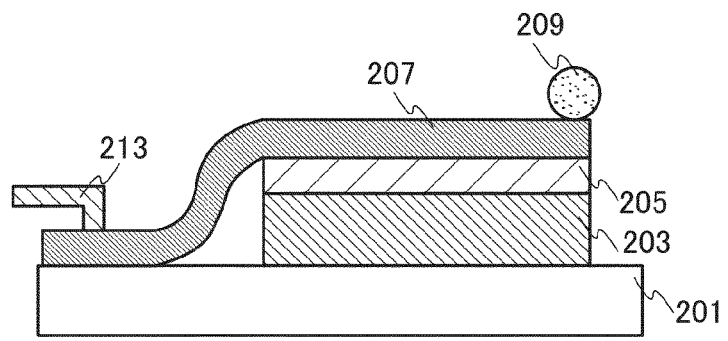

Therefore, as illustrated in FIGS. 2A to 2C, the fixing mechanism 213 is preferably configured to fix the end portion of the second member 207 which extends beyond the end portion of the first member 203. Here, the second member 207 having a larger size than the first member 203 is supplied. In addition, the fixing mechanism 213 fixes the second member 207 in a region which does not overlap with the first member 203 and the bonding layer 205.

Accordingly, pressure can be applied using the pressurizing mechanism 209 to the entire area where the first member 203 and the second member 207 overlap with each other (i.e., to the entire stack body to be manufactured). Therefore, inclusion of bubbles between the first member 203 and the second member 207 can be suppressed. In addition, thickness unevenness of the bonding layer 205 can be reduced. Since the position of the second member 207 can be fixed using the fixing mechanism 213, it is possible to suppress the displacement of the second member 207 relative to the first member 203 due to pressure application.

Figure 17B:
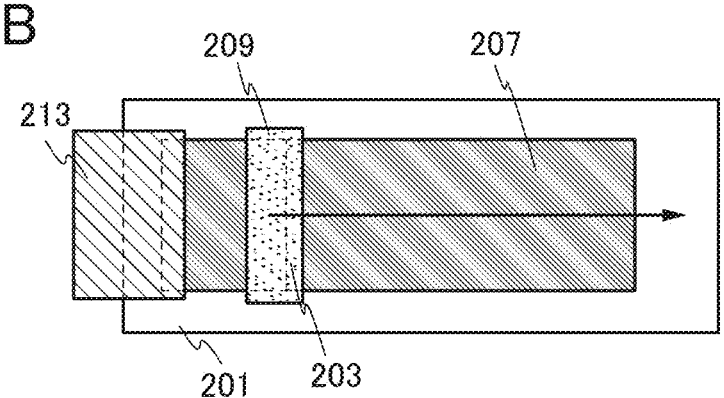

Note that FIG. 2B illustrates an example of the fixing mechanism 213 whose width is smaller than that of the second member 207; however, the present invention is not limited to this example, and a fixing mechanism whose width is larger than or equal to that of the second member 207 may be used. FIG. 17B illustrates the case of using the fixing mechanism 213 whose width is larger than that of the second member 207.

Figure 18C:
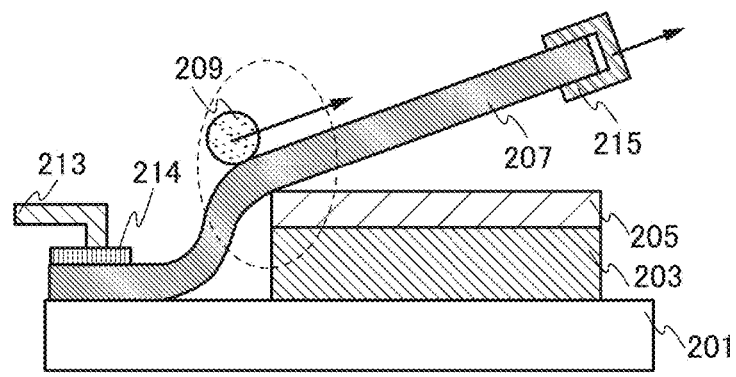
Figure 18D:
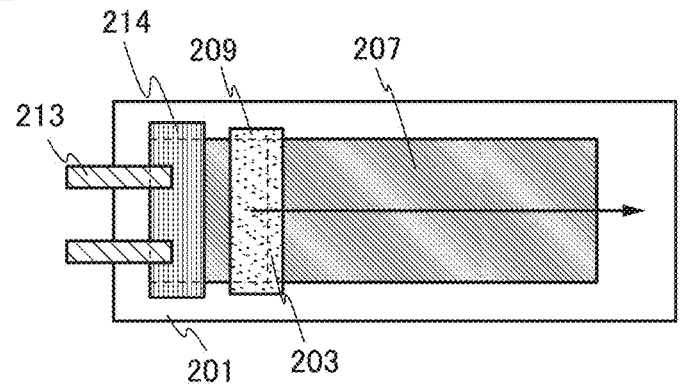

As illustrated in FIGS. 18C and 18D, the fixing mechanism 214 may be provided between the fixing mechanism 213 and the second member 207. A material similar to those in the structural example 1 can be used for the fixing mechanism 214.

Structural Example 3

In the structural example 2, as illustrated in a portion enclosed by a dotted line in FIG. 2A, the pressurizing mechanism 209 may climb over a large step when moving from a region of the second member 207 which does not overlap with the first member 203 to a region of the second member 207 which overlaps with the first member 203.

For example, in the case where the first member 203 includes a glass substrate, the glass substrate might be broken or cracked by pressure application by the pressurizing mechanism 209 to a corner portion of the glass substrate. Inclusion of a broken piece of glass might cause damage to a film included in the stack body. By such inclusion of a foreign substance, the reliability of the stack body may be lowered.

Figure 2D:
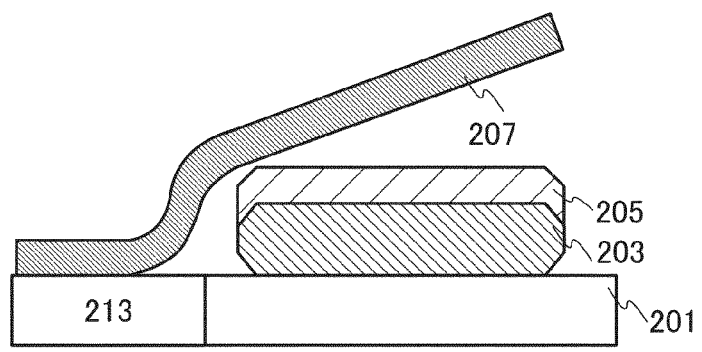

In view of this, as illustrated in FIG. 2D, a chamfered glass substrate is preferably used in the case where the first member 203 includes a glass substrate. In that case, breakage or cracking of the glass substrate can be suppressed even when the pressurizing mechanism 209 applies pressure to a corner portion of the glass substrate. Note that FIG. 2D illustrates the case where a suction chuck is used as the fixing mechanism 213.

Figure 3A:
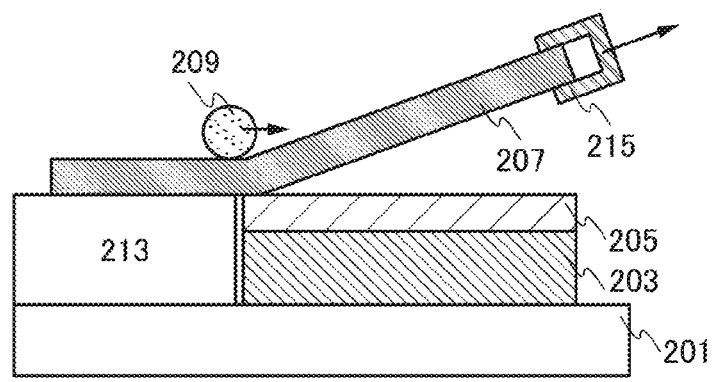
FIGS. 3A to 3D illustrate a bonding apparatus and a bonding method.
Figure 3B:
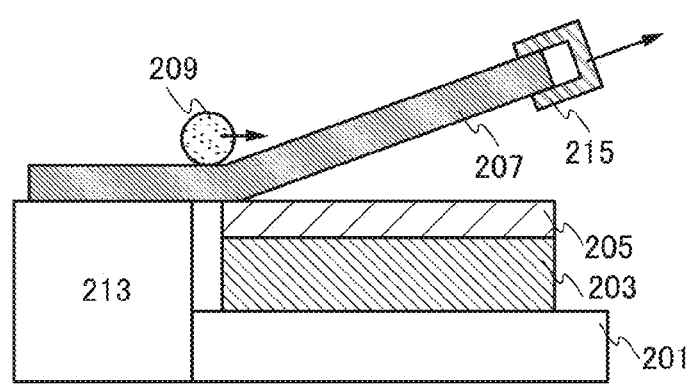
Figure 3C:
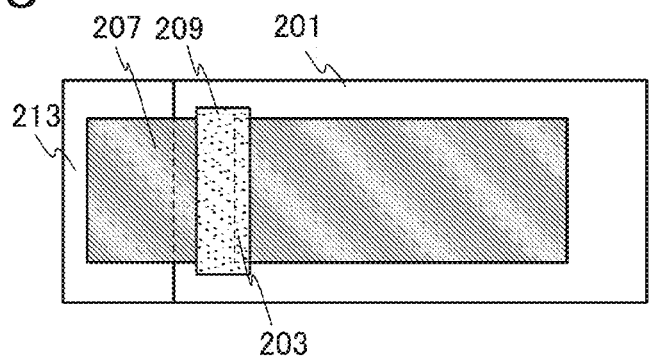

Furthermore, as illustrated in FIGS. 3A to 3C, the fixing mechanism 213 is preferably configured to fix the second member 207 so that the difference in height between a region of the second member 207 which overlaps with the fixing mechanism 213 and a region of the second member 207 which overlaps with the bonding layer 205 (or the first member 203) becomes smaller than the sum of thicknesses of the first member 203 and the bonding layer 205.

For example, FIG. 3A illustrates an example in which a suction chuck serving as the fixing mechanism 213 is placed over the stage 201 such that the fixing mechanism 213 and the bonding layer 205 are level with each other.

FIG. 3B illustrates an example in which a suction chuck serving as the fixing mechanism 213 is placed separately from the stage 201 such that the fixing mechanism 213 and the bonding layer 205 are level with each other.

Here, the gap between the fixing mechanism 213 and the first member 203 is preferably narrow. This can reduce thickness unevenness of the bonding layer 205 caused when the pressurizing mechanism 209 moves between the fixing mechanism 213 and the first member 203.

Accordingly, pressure can be applied using the pressurizing mechanism 209 to the entire area where the first member 203 and the second member 207 overlap with each other. Therefore, inclusion of bubbles between the first member 203 and the second member 207 can be suppressed. In addition, thickness unevenness of the bonding layer 205 can be reduced. Since the position of the second member 207 can be fixed using the fixing mechanism 213, it is possible to suppress the displacement of the second member 207 relative to the first member 203 due to pressure application. Furthermore, even when a fragile material such as glass is used for the first member 203, inclusion of a foreign substance in the stack body can be suppressed.

Note that in FIGS. 3A to 3C, the fixing mechanism 213 is used to make the difference in height between the region of the second member 207 which overlaps with the fixing mechanism 213 and the region of the second member 207 which overlaps with the bonding layer 205 (or the first member 203) smaller than the sum of thicknesses of the first member 203 and the bonding layer 205; however, the present invention is not limited to the examples.

Figure 3D:
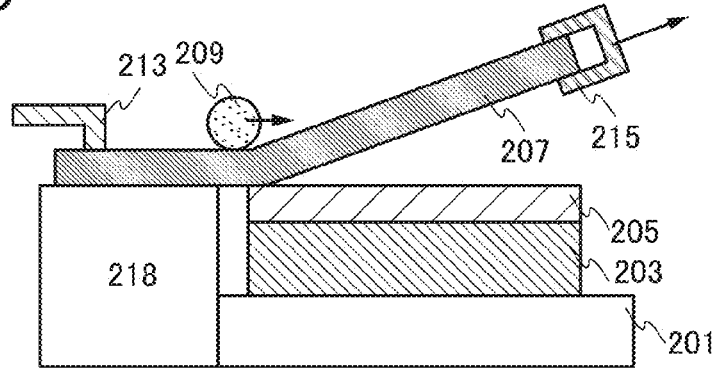

For example, as illustrated in FIG. 3D, the end portion of the second member 207 which extends beyond the end portion of the first member 203 may be placed over a spacer 218. Then, the second member 207 may be fixed over the spacer 218 using a mechanical chuck as the fixing mechanism 213.

Figure 19A:
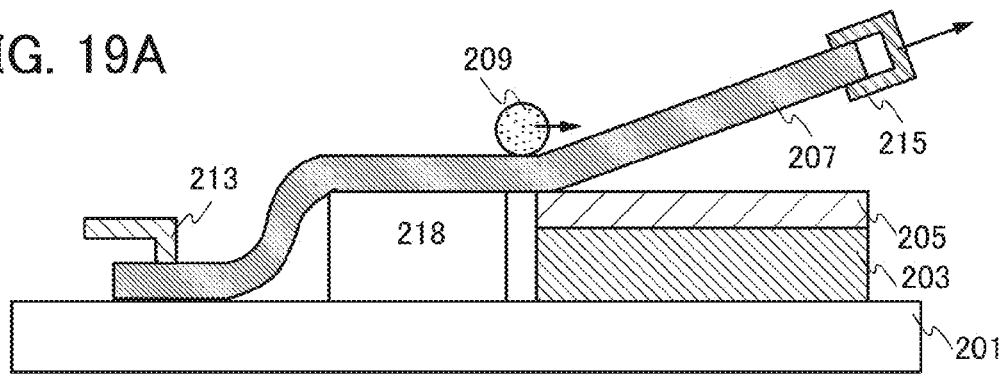
FIGS. 19A to 19D illustrate a bonding apparatus and a bonding method.
Figure 19B:
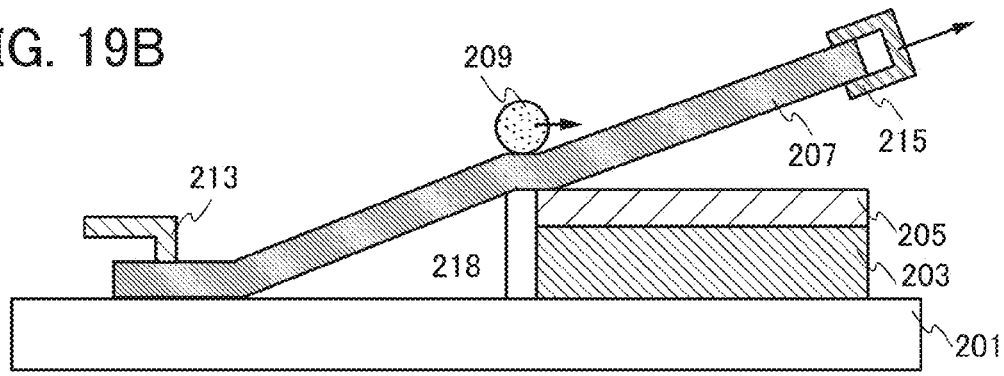

Alternatively, as illustrated in FIG. 19A, the fixing mechanism 213 may be used on the outer side of the spacer 218. Still alternatively, as illustrated in FIG. 19B, the spacer 218 may have a slope. By placing the second member 207 on the slope, localized pressure is less likely to be applied to the second member 207, and damage to the second member 207 can be suppressed.

Figure 19C:
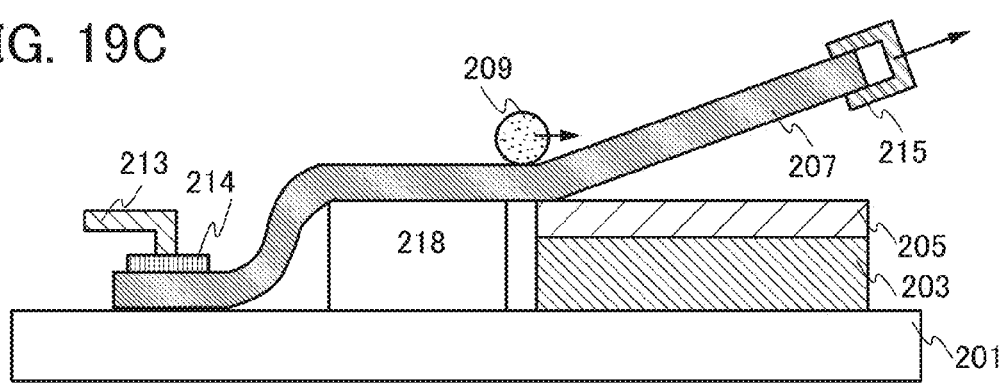
Figure 19D:
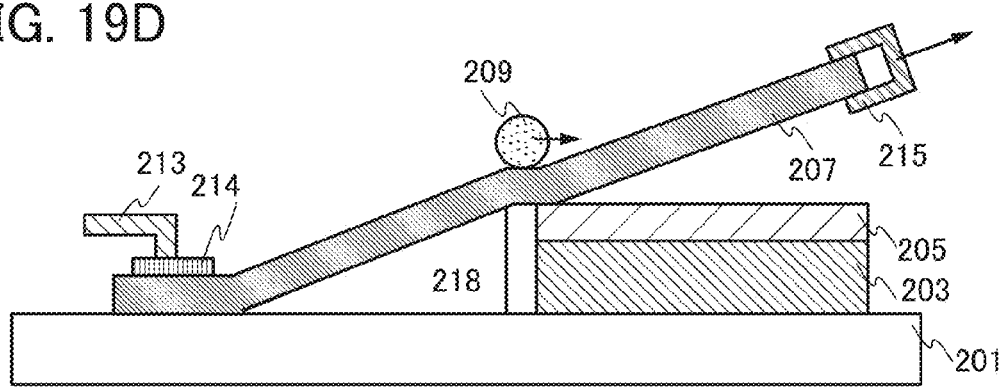

Note that even in the case of using the spacer 218, the width of the fixing mechanism is not limited. A fixing mechanism whose width is smaller than that of the second member 207 may be used, or a fixing mechanism whose width is larger than or equal to that of the second member 207 may be used. Alternatively, as illustrated in FIGS. 19C and 19D, the fixing mechanism 214 may be used.

Modification Example 1

Figure 4A:
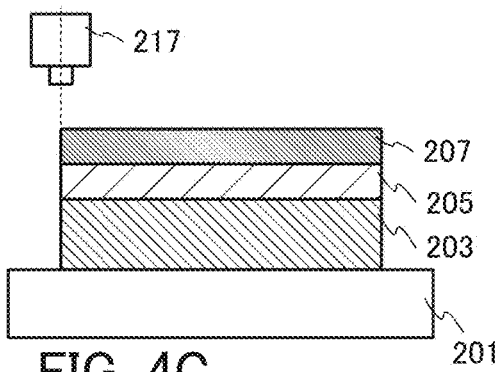
FIGS. 4A to 4H illustrate a bonding apparatus and a bonding method.
Figure 4B:
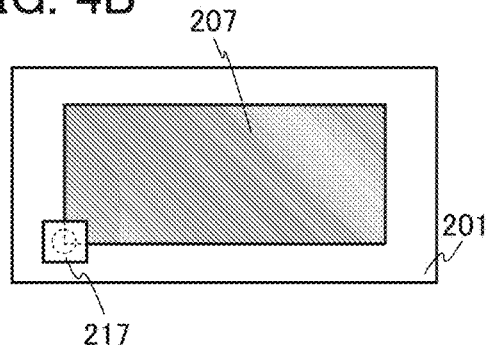

A bonding apparatus in one embodiment of the present invention may include an alignment camera 217 as illustrated in FIGS. 4A and 4B. For example, it is possible to take an image to determine whether the first member 203 or the second member 207 is placed over a predetermined position of the stage 201. The bonding apparatus may include an alignment system or the like. Alternatively, an alignment marker may be used. FIGS. 4A and 4B illustrate an example in which the camera 217 takes an image to determine whether the end portion of the second member 207 and the end portion of the first member 203 are aligned.

Modification Example 2

Figure 4C:
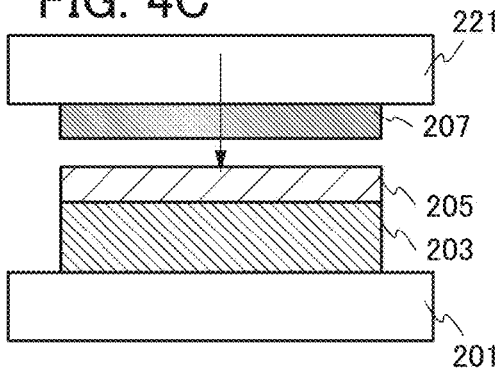

A bonding apparatus in one embodiment of the present invention includes a stage capable of supporting a first member having a sheet-like shape, and a stage capable of supporting a second member having a sheet-like shape so that the second member overlaps with the first member. The distance between the two stages is adjustable. Pressure can be applied to the two members by decreasing the distance between the two stages, whereby the first member and the second member can be bonded to each other using a bonding layer between the first member and the second member (FIGS. 4C to 4E and FIG. 24B). FIG. 4C illustrates the case where a stage 221 is movable; the stage 201 may be movable, or both the stage 201 and the stage 221 may be movable. Furthermore, FIG. 4C illustrates the case where the bonding layer 205 is provided over the first member 203; however, the second member 207 may be provided with the bonding layer 205. One or both of the two stages may have a heating mechanism, and for example, pressure may be applied to the members by the stage(s) at 100° C.

Figure 4D:
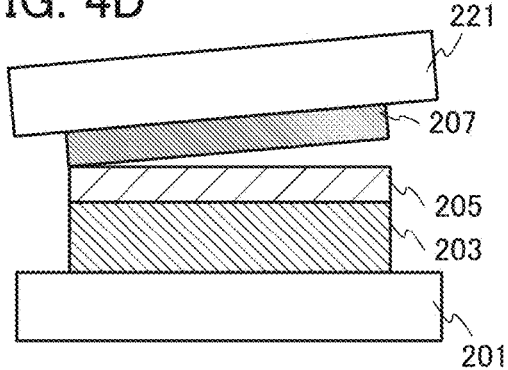
Figure 4E:
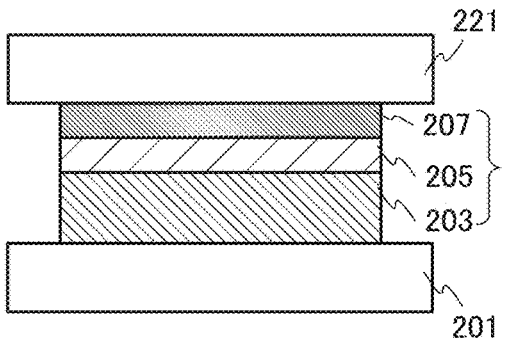

Bonding may be performed by applying pressure to entire opposing surfaces at the same time as illustrated in FIG. 4C, or bonding of the first member 203 and the second member 207 may be started from one end portion as illustrated in FIG. 4D.

The use of the above bonding apparatus can suppress a problem of displacement of the first member 203 and the second member 207 and can improve a yield.

Modification Example 3

When the pressurizing mechanism 209 moves over the stage 201 with the first member 203, the bonding layer 205, and the second member 207 placed therebetween, if the stage 201 has an uneven surface, depending on the degree of unevenness or the difference in height, there may occur problems such as thickness unevenness of the bonding layer 205, a crack caused in the stack body 250 by localized force application, and transfer of the unevenness to the stack body 250.

Figure 4F:
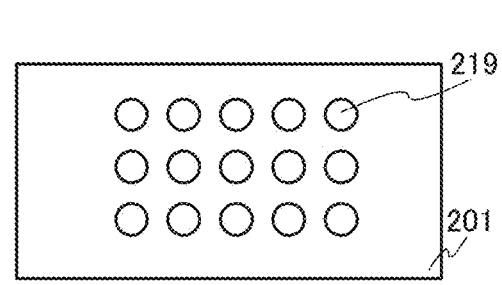

For example, in the case where the stage 201 has suction holes 219 for suction of the first member as illustrated in FIG. 4F or is provided with lift pins, the diameter of an opening in the stage 201 is preferably 10 mm or less, more preferably 6 mm or less.

For example, the diameter of the opening in the stage 201 is preferably 1 μm or more and 10 mm or less, more preferably 1 μm or more and 8 mm or less, still more preferably 1 μm or more and 1 mm or less, and particularly preferably 1 μm or more and 500 μm or less.

Note that the range of allowable diameters of the opening depends on the material of a member to which pressure is to be applied, the material of the pressurizing mechanism, the pressure to be applied, or the like.

Figure 4G:
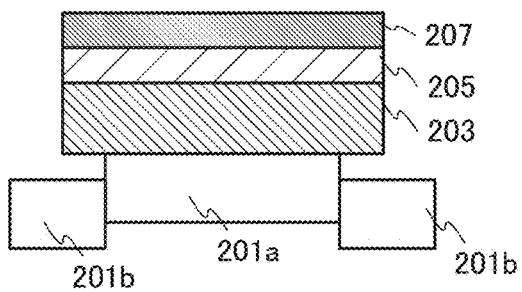
Figure 4H:
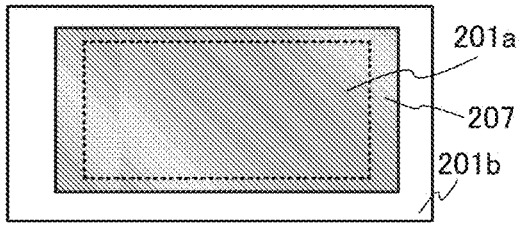

With a movable stage which is divided into a plurality of parts, an end portion of a stack body can be easily held and the stack body can be easily transported without using lift pins or the like. Lift pins or the like which are not rearrangeable may be unable to hold and transport the first member 203 or the stack body 250 in different shapes. For example, a stage which is divided into a plurality of parts can lift the first member 203 or the stack body 250 in different shapes by moving one or more of the parts in a direction perpendicular to the horizontal plane. For example, as illustrated in FIGS. 4G and 4H, when a stage is divided into an inner part 201a and an outer part 201b surrounding the inner part 201a and the outer part 201b is moved downward, the transport mechanism can easily hold the end portion of the first member 203. Accordingly, surface unevenness of the stage can be reduced, and the yield of the bonding step can be improved.

Note that in FIGS. 4G and 4H, only the inner part 201a may be referred to as a stage and the outer part 201b may be referred to as a frame part. It is preferable that the fixing mechanism be used for the inner part 201a serving as a stage to fix the first member 203 and that the fixing mechanism not be used for the outer part 201b serving as a frame part.

For example, when the first member 203 is fixed using a porous chuck, there may occur a problem in that the material of the bonding layer 205 spreads beyond the end portions of the first member 203 and the second member 207 and is sucked into the porous chuck. Therefore, in one embodiment of the present invention, the end portion of the first member 203 and the end portion of the second member 207 are each preferably placed so as to overlap with the outer part 201b (frame part). In addition, a surface of the frame part which overlaps with the first member 203 is preferably a flat surface. In that case, spread of the material of the bonding layer 205 into the inner part 201a serving as the stage can be suppressed, and sucking of the material into the porous chuck can be suppressed.

This embodiment can be combined with any of the other embodiments in this specification as appropriate.

Embodiment 2

In this embodiment, a stack body manufacturing apparatus in one embodiment of the present invention will be described with reference to FIG. 6 and FIGS. 7A to 7E.

The stack body manufacturing apparatus in one embodiment of the present invention includes a first supply unit configured to supply a process member having a sheet-like shape, a first separation unit configured to be supplied with the process member and separate the process member into one surface layer and a first remaining portion, a support body supply unit configured to supply a first support body having a sheet-like shape, a first bonding unit configured to be supplied with the first remaining portion and the first support body and bond the first remaining portion and the first support body to each other with a first bonding layer, and a first unloading unit configured to unload a first stack body including the first remaining portion, the first bonding layer, and the first support body. The first bonding unit includes the bonding apparatus described in Embodiment 1.

The stack body manufacturing apparatus having the above structure manufactures a stack body using the sheet-like process member supplied to the first supply unit. The first separation unit separates the process member into the one surface layer and the first remaining portion. The first bonding unit bonds the first remaining portion and the sheet-like first support body supplied from the support body supply unit to each other with the first bonding layer. Then, the first unloading unit unloads the first stack body including the first remaining portion, the first bonding layer, and the first support body.

In the case where the first bonding unit includes the bonding apparatus described in Embodiment 1, the bonding apparatus includes a first stage capable of supporting the first remaining portion having a sheet-like shape, a first fixing mechanism capable of fixing one end portion of the first support body having a sheet-like shape so that the first support body overlaps with the first remaining portion, and a first pressurizing mechanism capable of moving from a side of the one end portion of the first support body to a side of the other end portion and spreading the first bonding layer under pressure between the first remaining portion and the first support body. The first remaining portion and the first support body are bonded to each other.

The use of the first pressurizing mechanism can reduce thickness unevenness of the first bonding layer and inclusion of bubbles in the first stack body. In a state where the first fixing mechanism fixes the one end portion of the first support body to fix the position of the first support body relative to the first remaining portion, the first pressurizing mechanism can move from a side of the one end portion of the first support body to the other end portion. This can suppress displacement of the first support body relative to the first remaining portion due to pressure application.

In this manner, by using the stack body manufacturing apparatus in one embodiment of the present invention, the first stack body including the first remaining portion, the first bonding layer, and the first support body can be manufactured.

Figure 6:
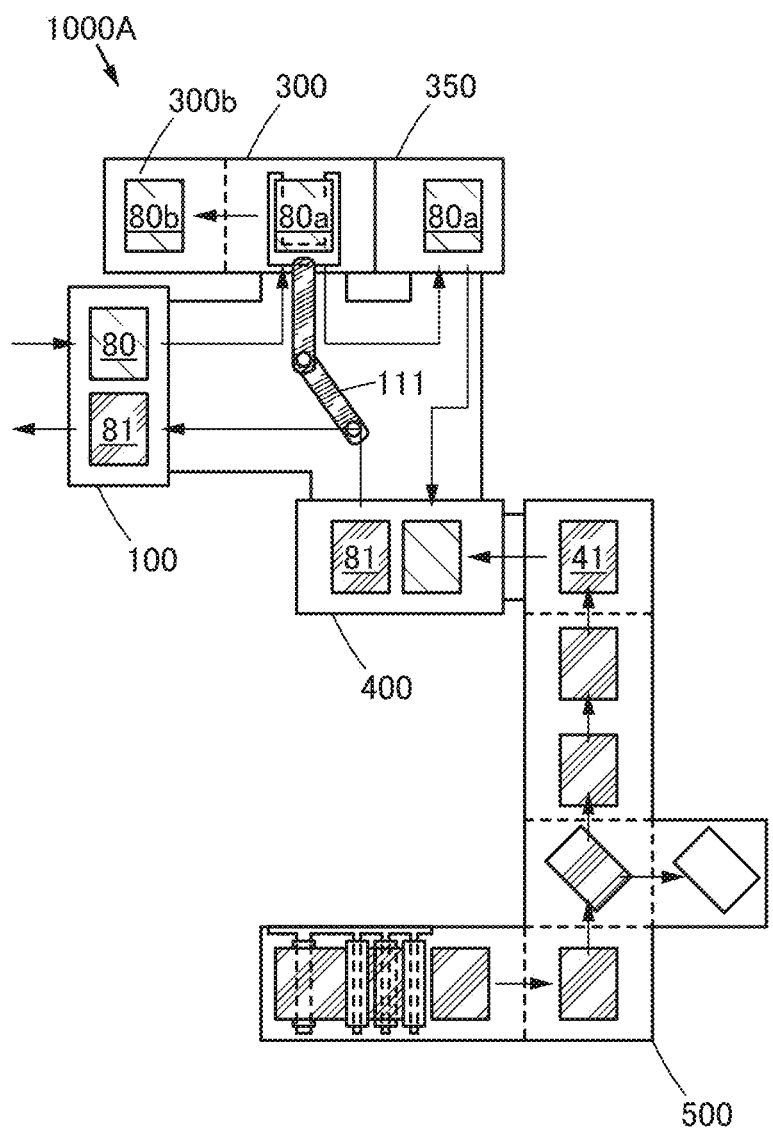
FIG. 6 illustrates a stack body manufacturing apparatus.

FIG. 6 is a schematic view illustrating a structure of a stack body manufacturing apparatus 1000A in one embodiment of the present invention, and a transport path of a process member and a stack body in a process. Each unit preferably includes an ionizer so as to be able to prevent charging of a support body or the like during transport and processing. The cleanliness of the apparatus is preferably Class 100.

Figure 7A:
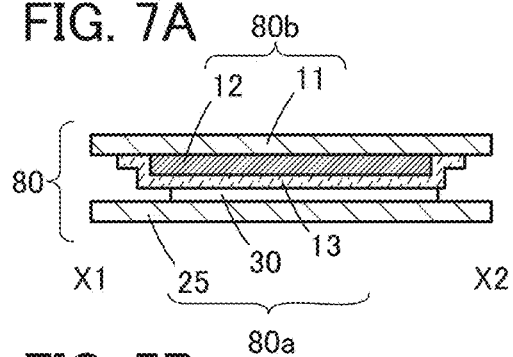
FIGS. 7A to 7E illustrate a stack body manufacturing process.
Figure 7A:
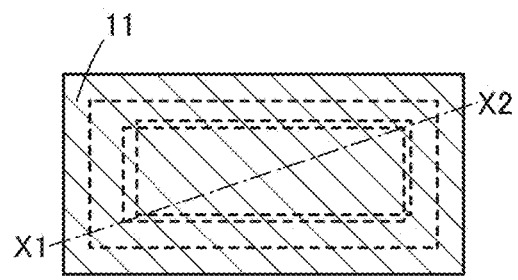
Figure 7B:
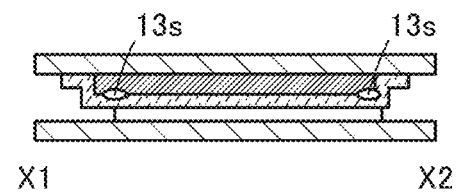
Figure 7B:
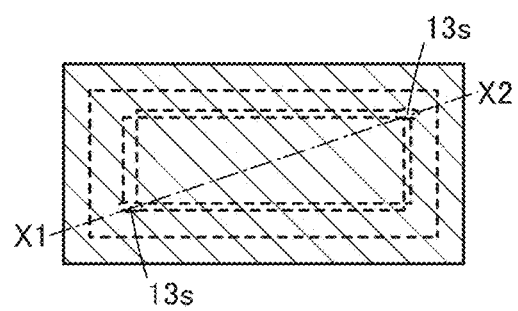
Figure 7C:
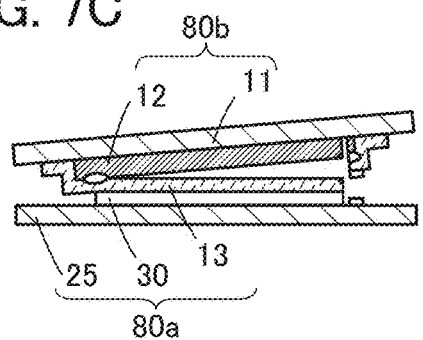

FIGS. 7A to 7E are schematic views illustrating a process for manufacturing a stack body with the use of the stack body manufacturing apparatus 1000A in one embodiment of the present invention. FIGS. 7A, 7B, 7D, and 7E each illustrate a plan view and a cross-sectional view taken along dashed-dotted line X1-X2 in the plan view. FIG. 7C illustrates only a cross-sectional view.

The stack body manufacturing apparatus 1000A described in this embodiment includes a first supply unit 100, a first separation unit 300, a first bonding unit 400, and a support body supply unit 500 (FIG. 6).

Note that each unit can be named freely, and the name does not limit the function of each unit.

In this embodiment, an example in which the first bonding unit 400 includes the bonding apparatus in one embodiment of the present invention that is described in Embodiment 1 is described.

The first supply unit 100 can supply a process member 80. Note that the first supply unit 100 can also serve as a first unloading unit.

The first separation unit 300 can separate one surface layer 80b and a first remaining portion 80a of the process member 80 from each other (FIG. 6 and FIGS. 7A to 7C).

Note that in this specification, the surface layer may have a stacked-layer structure instead of a single-layer structure as long as it includes an outermost layer. For example, the one surface layer 80b in FIG. 7A corresponds to a first substrate 11 and a first separation layer 12.

Figure 7D:
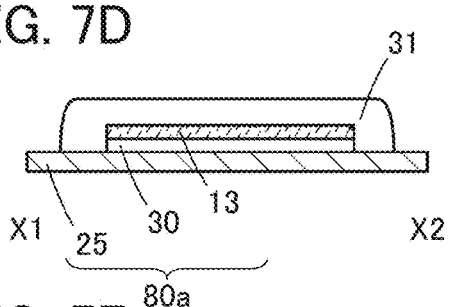
Figure 7D:
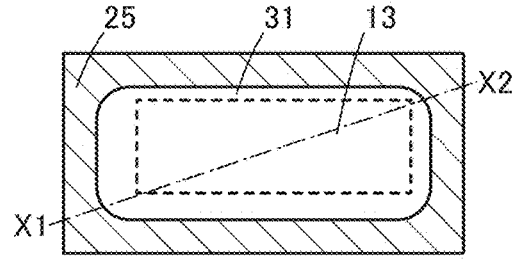

The first bonding unit 400 is supplied with the first remaining portion 80a and a first support body 41. The first bonding unit 400 bonds the first support body 41 and the first remaining portion 80a to each other with a first bonding layer 31 (FIG. 6 and FIGS. 7D and 7E).

The support body supply unit 500 supplies the first support body 41 (FIG. 6).

Figure 7E:
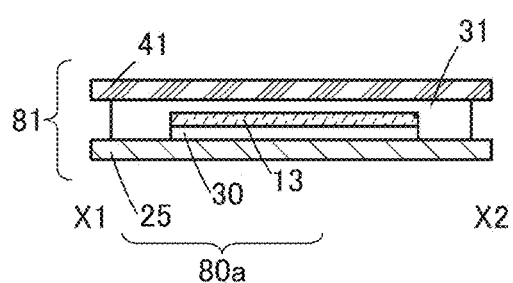
Figure 7E:
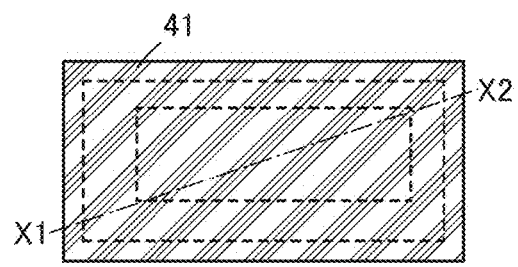

The first supply unit 100 also serving as the first unloading unit can unload a stack body 81 including the first remaining portion 80a, the first bonding layer 31, and the first support body 41 (FIG. 6 and FIG. 7E). The stack body manufacturing apparatus in one embodiment of the present invention may include an unloading unit and a supply unit separately.

The above stack body manufacturing apparatus in one embodiment of the present invention includes the first supply unit 100 that supplies the process member 80 and also serves as an unloading unit for unloading the stack body 81, the first separation unit 300 that separates the one surface layer 80b and the first remaining portion 80a of the process member 80 from each other, the first bonding unit 400 that bonds the first support body 41 to the first remaining portion 80a, and the support body supply unit 500 that supplies the first support body 41. This structure makes it possible to separate the one surface layer 80b of the process member 80 and bond the first support body 41 to the first remaining portion 80a separated. As described above, one embodiment of the present invention can provide an apparatus for manufacturing a stack body including a support body and a remaining portion of a process member.

Furthermore, the stack body manufacturing apparatus 1000A in this embodiment includes a first storage portion 300b, a first cleaning device 350, a transport mechanism 111, and the like.

The first storage portion 300b stores the one surface layer 80b separated from the process member 80.

The first cleaning device 350 cleans the first remaining portion 80a separated from the process member 80.

The transport mechanism 111 transports the process member 80, the first remaining portion 80a separated from the process member 80, and the stack body 81.

<<Stack Body Manufacturing Apparatus>>

Individual components of the stack body manufacturing apparatus in one embodiment of the present invention will be described below.

<First Supply Unit>

The first supply unit 100 supplies the process member 80. For example, to allow the transport mechanism 111 to transport a plurality of process members 80 successively, a multistage storage capable of storing the plurality of process members 80 can be included.

Furthermore, the first supply unit 100 in this embodiment also serves as the first unloading unit. The first supply unit 100 unloads the stack body 81 including the first remaining portion 80a, the first bonding layer 31, and the first support body 41. For example, to allow the transport mechanism 111 to transport a plurality of stack bodies 81 successively, a multistage storage capable of storing the plurality of stack bodies 81 can be included.

<First Separation Unit>

The first separation unit 300 includes a mechanism for holding one surface layer of the process member 80 and a mechanism for holding the other surface layer (corresponding to the first remaining portion 80a here) facing the one surface layer. The holding mechanisms are pulled away from each other, whereby the one surface layer of the process member 80 is separated to form the first remaining portion 80a.

<First Bonding Unit>

The first bonding unit 400 includes the bonding apparatus in one embodiment of the present invention that is described as an example in Embodiment 1. The atmosphere in the first bonding unit 400 may be an air atmosphere or a reduced-pressure atmosphere. The first bonding unit 400 is preferably connected to an evacuation mechanism such as a dry pump, a rotary pump, or a diaphragm pump.

<Support Body Supply Unit>

The support body supply unit 500 supplies the first support body 41. For example, the support body supply unit 500 unrolls a film which is supplied in a rolled shape, cuts the film to a predetermined length, activates a surface of the film, and supplies the film as the first support body 41.

<Stack Body Manufacturing Method>

A method for manufacturing the stack body 81 from the process member 80 with the use of the stack body manufacturing apparatus 1000A will be described below with reference to FIG. 6 and FIGS. 7A to 7E.

The process member 80 includes the first substrate 11, the first separation layer 12 on the first substrate 11, a first layer 13 to be separated (hereinafter simply referred to as the first layer 13) whose one surface is in contact with the first separation layer 12, a bonding layer 30 whose one surface is in contact with the other surface of the first layer 13, a base 25 in contact with the other surface of the bonding layer 30 (FIG. 7A). Note that in this embodiment, description is given of a case of using the process member 80 in which separation triggers 13s are formed in advance near end portions of the bonding layer 30 (FIG. 7B). The structure of the process member 80 is described in detail in Embodiment 4.

<First Step>

The process member 80 is loaded into the first supply unit 100. The first supply unit 100 supplies the process member 80, and the transport mechanism 111 transports the process member 80 and supplies the process member 80 to the first separation unit 300.

<Second Step>

The first separation unit 300 separates the one surface layer 80b of the process member 80. Specifically, from the separation trigger 13s formed near the end portion of the bonding layer 30, the first substrate 11 and the first separation layer 12 are separated from the first layer 13 (FIG. 7C).

By this step, the first remaining portion 80a is obtained from the process member 80. Specifically, the first remaining portion 80a includes the first layer 13, the bonding layer 30 whose one surface is in contact with the first layer 13, and the base 25 in contact with the other surface of the bonding layer 30. Note that a portion of the bonding layer 30 on the outer side of the separation triggers 13s remains at least in the first remaining portion 80a or on the one surface layer 80b. Although FIG. 7C illustrates an example in which portions of the bonding layer 30 remain on both sides, the present invention is not limited to this example. After the separation, a portion of the bonding layer 30 which remains in the first remaining portion 80a and which does not contribute to bonding between the first layer 13 and the base 25 may be removed. Such removal is preferable because an adverse effect on the functional element in a subsequent step (e.g., entry of impurities) can be suppressed. For example, an unnecessary resin can be removed by wiping, cleaning, or the like.

<Third Step>

The transport mechanism 111 transports the first remaining portion 80a. The first cleaning device 350 cleans the first remaining portion 80a supplied thereto.

The transport mechanism 111 transports the first remaining portion 80a after the cleaning and supplies the first remaining portion 80a to the first bonding unit 400. The support body supply unit 500 supplies the first support body 41 to the first bonding unit 400.

Note that the transport mechanism 111 may supply the first remaining portion 80a from the first separation unit 300 directly to the first bonding unit 400 without supplying it to the cleaning device.

The first bonding unit 400 forms the first bonding layer 31 over the first remaining portion 80a supplied thereto (FIG. 7D), and bonds the first remaining portion 80a and the first support body 41 to each other with the first bonding layer 31 (FIG. 7E).

By this step, the stack body 81 is obtained using the first remaining portion 80a. Specifically, the stack body 81 includes the first support body 41, the first bonding layer 31, the first layer 13, the bonding layer 30 whose one surface is in contact with the first layer 13, and the base 25 in contact with the other surface of the bonding layer 30.

<Fourth Step>

The transport mechanism 111 transports the stack body 81, and the stack body 81 is supplied to the first supply unit 100 also serving as the first unloading unit.

After this step, the stack body 81 can be unloaded.

<Another Step>

Note that when it takes time to cure the first bonding layer 31, it is preferable that the stack body 81 in which the first bonding layer 31 is not cured yet be unloaded and the first bonding layer 31 be cured outside the stack body manufacturing apparatus 1000A, in which case occupancy time of the apparatus can be reduced.

This embodiment can be combined with any of the other embodiments in this specification as appropriate.

Embodiment 3

In this embodiment, a stack body manufacturing apparatus in one embodiment of the present invention will be described with reference to FIG. 8, FIGS. 9A to 9E, and FIGS. 10A to 10E.

The stack body manufacturing apparatus in one embodiment of the present invention includes a first supply unit configured to supply a process member having a sheet-like shape, a first separation unit configured to be supplied with the process member and separate the process member into one surface layer and a first remaining portion, a support body supply unit configured to supply a first support body and a second support body each having a sheet-like shape, a first bonding unit configured to be supplied with the first remaining portion and the first support body and bond the first remaining portion and the first support body to each other with a first bonding layer, a first unloading unit configured to unload a first stack body including the first remaining portion, the first bonding layer, and the first support body, a second supply unit configured to supply the first stack body, a trigger formation unit configured to be supplied with the first stack body and form a separation trigger near an end portion of the first remaining portion, a second separation unit configured to be supplied with the first stack body including the separation trigger and separate the first stack body into one surface layer and a second remaining portion, a second bonding unit configured to be supplied with the second remaining portion and the second support body and bond the second remaining portion and the second support body to each other with a second bonding layer, and a second unloading unit configured to unload a second stack body including the second remaining portion, the second bonding layer, and the second support body. At least one of the first bonding unit and the second bonding unit includes the bonding apparatus described in Embodiment 1.

The stack body manufacturing apparatus having the above structure manufactures a stack body using the sheet-like process member supplied to the first supply unit. The first separation unit separates the process member into the one surface layer and the first remaining portion. The first bonding unit bonds the first remaining portion and the first support body supplied from the support body supply unit to each other with the first bonding layer. Then, the first unloading unit unloads the first stack body including the first remaining portion, the first bonding layer, and the first support body, and supplies the first stack body to the second supply unit. The trigger formation unit forms the separation trigger in the first stack body supplied from the second supply unit. The second separation unit separates the first stack body including the separation trigger into the one surface layer and the second remaining portion. The second bonding unit bonds the second remaining portion and the second support body supplied from the support body supply unit to each other with the second bonding layer. Then, the second unloading unit unloads the second stack body including the second remaining portion, the second bonding layer, and the second support body.

In the case where the first bonding unit includes the bonding apparatus described in Embodiment 1, the bonding apparatus includes a first stage capable of supporting the first remaining portion having a sheet-like shape, a first fixing mechanism capable of fixing one end portion of the first support body having a sheet-like shape so that the first support body overlaps with the first remaining portion, and a first pressurizing mechanism capable of moving from a side of the one end portion of the first support body to a side of the other end portion and spreading the first bonding layer under pressure between the first remaining portion and the first support body. The first remaining portion and the first support body are bonded to each other.

The use of the first pressurizing mechanism can reduce thickness unevenness of the first bonding layer and inclusion of bubbles in the first stack body. In a state where the first fixing mechanism fixes the one end portion of the first support body to fix the position of the first support body relative to the first remaining portion, the first pressurizing mechanism can move from a side of the one end portion of the first support body to the other end portion. This can suppress displacement of the first support body relative to the first remaining portion due to pressure application.

In this manner, by using the stack body manufacturing apparatus in one embodiment of the present invention, the first stack body including the first remaining portion, the first bonding layer, and the first support body can be manufactured.

In the case where the second bonding unit includes the bonding apparatus described in Embodiment 1, the bonding apparatus includes a second stage capable of supporting the second remaining portion having a sheet-like shape, a second fixing mechanism capable of fixing the one end portion of the second support body having a sheet-like shape so that the second support body overlaps with the second remaining portion, and a second pressurizing mechanism capable of moving from a side of the one end portion of the second support body to a side of the other end portion and spreading the second bonding layer under pressure between the second remaining portion and the second support body. The second remaining portion and the second support body are bonded to each other.

The use of the second pressurizing mechanism can reduce thickness unevenness of the second bonding layer and inclusion of bubbles in the second stack body. In a state where the second fixing mechanism fixes the one end portion of the second support body to fix the position of the second support body relative to the second remaining portion, the second pressurizing mechanism can move from a side of the one end portion of the second support body to the other end portion. This can suppress displacement of the second support body relative to the second remaining portion due to pressure application.

In this manner, by using the stack body manufacturing apparatus in one embodiment of the present invention, the second stack body including the second remaining portion, the second bonding layer, and the second support body can be manufactured.

Figure 8:
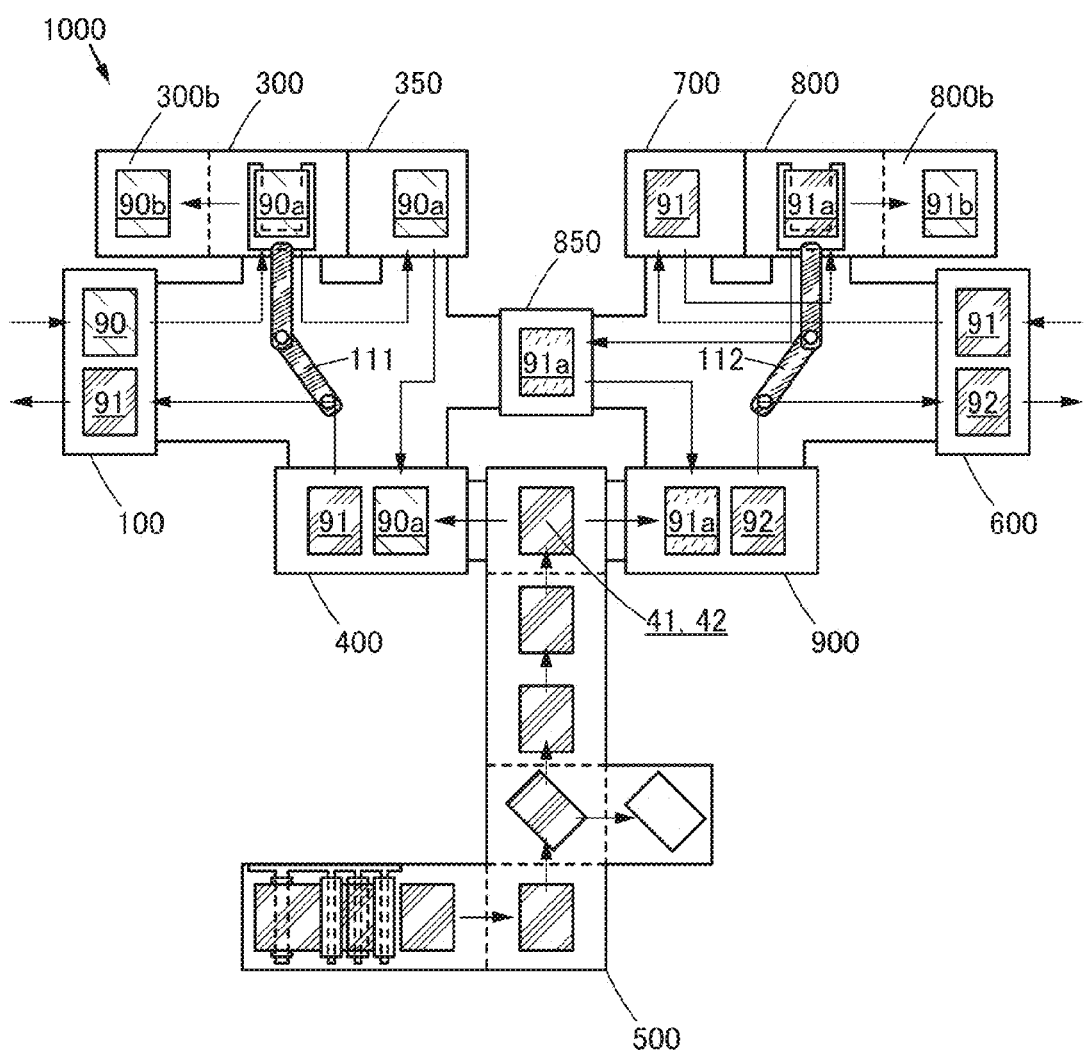
FIG. 8 illustrates a stack body manufacturing apparatus.

FIG. 8 is a schematic view illustrating a structure of a stack body manufacturing apparatus 1000 in one embodiment of the present invention, and a transport path of a process member and a stack body in a process.

Figure 9A:
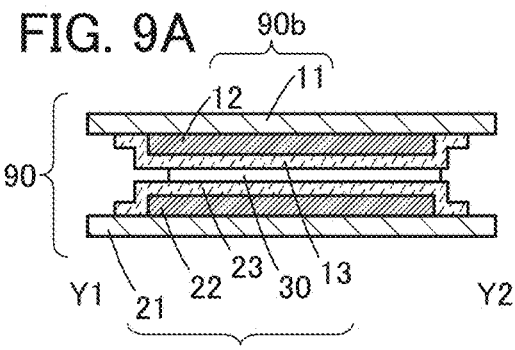
FIGS. 9A to 9E illustrate a stack body manufacturing process.
Figure 9A:
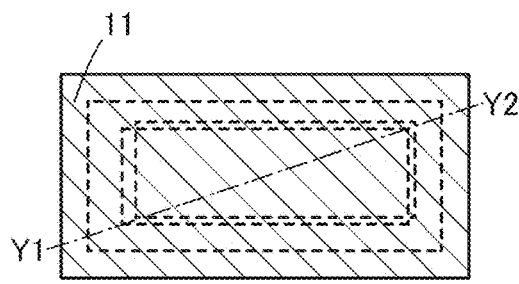
Figure 9B:
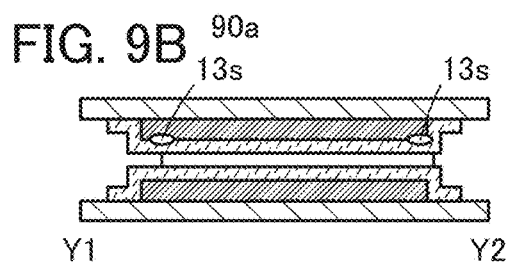
Figure 9B:
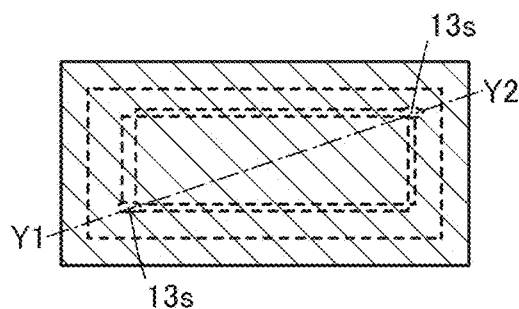
Figure 9C:
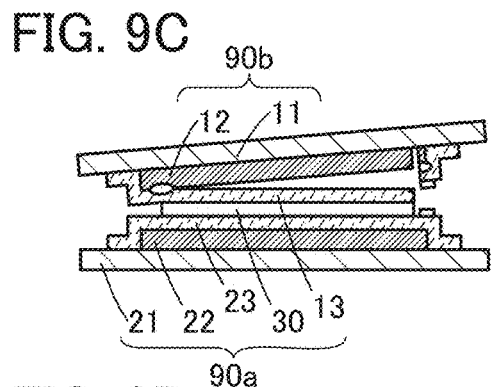
Figure 9D:
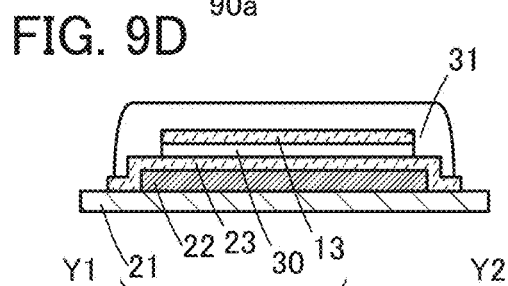
Figure 9D:
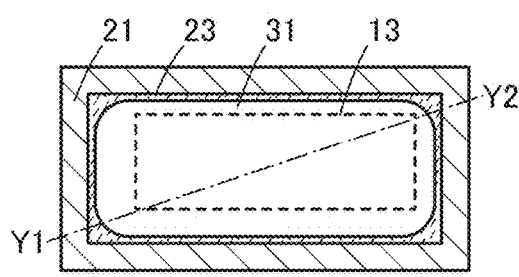
Figure 9E:
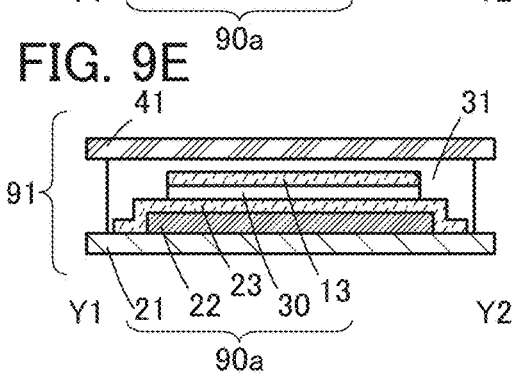
Figure 9E:
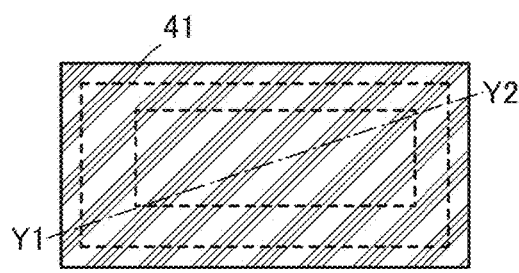
Figure 10A:
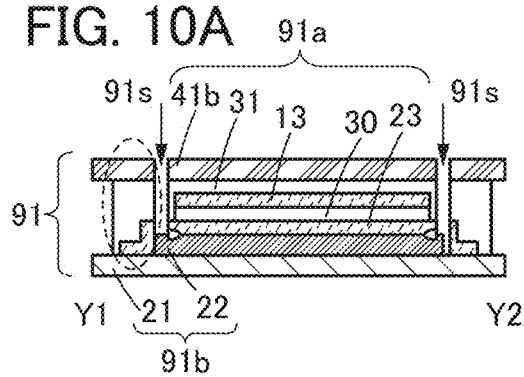
FIGS. 10A to 10E illustrate a stack body manufacturing process.
Figure 10A:
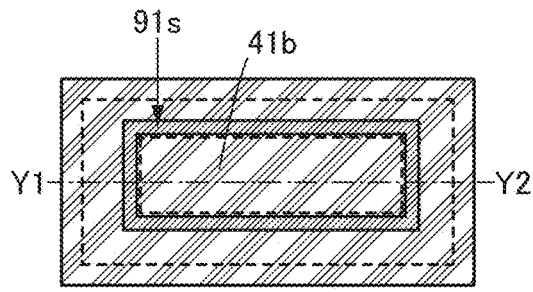
Figure 10B:
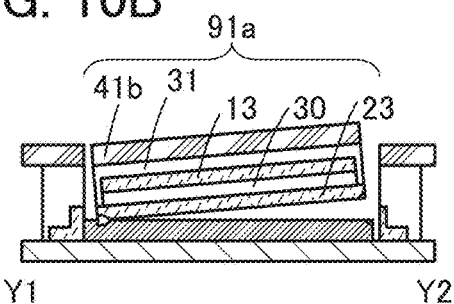
Figure 10C:
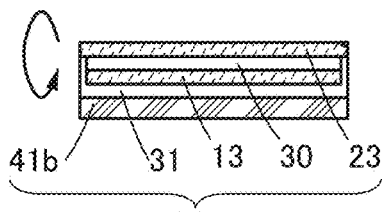

FIGS. 9A to 9E and FIGS. 10A to 10E are schematic views illustrating a process for manufacturing a stack body with the use of the stack body manufacturing apparatus 1000 in one embodiment of the present invention. FIGS. 9A, 9B, 9D, and 9E and FIGS. 10A, 10D, and 10E each illustrate a plan view and a cross-sectional view taken along dashed-dotted line Y1-Y2 in the plan view. FIG. 9C and FIGS. 10B and 10C each illustrate only a cross-sectional view.

The stack body manufacturing apparatus 1000 described in this embodiment includes a first supply unit 100, a first separation unit 300, a first bonding unit 400, a support body supply unit 500, a second supply unit 600, a trigger formation unit 700, a second separation unit 800, and a second bonding unit 900.

Note that each unit can be named freely, and the name does not limit the function of each unit.

In this embodiment, an example in which the first bonding unit 400 and the second bonding unit 900 each include the bonding apparatus in one embodiment of the present invention that is described in Embodiment 1 is described. The present invention is not limited to this example, and in the stack body manufacturing apparatus in one embodiment of the present invention, at least one of the first bonding unit 400 and the second bonding unit 900 includes the bonding apparatus in one embodiment of the present invention.

The first supply unit 100 can be supplied with a process member 90 and supply the process member 90. Note that the first supply unit 100 can also serve as a first unloading unit.

The first separation unit 300 can separate one surface layer 90b and a first remaining portion 90a of the process member 90 from each other (FIG. 8 and FIGS. 9A to 9C).

The first bonding unit 400 is supplied with the first remaining portion 90a and a first support body 41, and bonds the first support body 41 and the first remaining portion 90a to each other with a first bonding layer 31 (FIG. 8 and FIGS. 9D and 9E).

The support body supply unit 500 supplies the first support body 41 and a second support body 42 (FIG. 8).

The first supply unit 100 also serving as the first unloading unit can be supplied with a stack body 91 including the first remaining portion 90a, the first bonding layer 31, and the first support body 41 and unload the stack body 91 (FIG. 8 and FIG. 9E).

The second supply unit 600 can be supplied with the stack body 91 and supply the stack body 91. Note that the second supply unit 600 can also serve as a second unloading unit.

The trigger formation unit 700 forms a separation trigger 91s near end portions of the first remaining portion 90a (FIG. 10A). Specifically, part of a second layer 23 to be separated (hereinafter simply referred to as the second layer 23) which overlaps with a second separation layer 22 and the first separation layer 31 is removed.

The second separation unit 800 separates one surface layer 91b and a second remaining portion 91a of the stack body 91 from each other (FIGS. 10A and 10B).

Figure 10D:
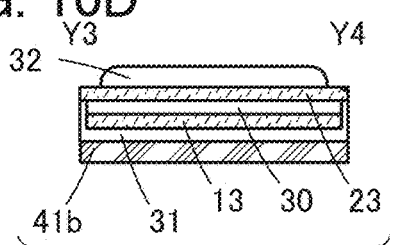
Figure 10D:
Figure 10E:
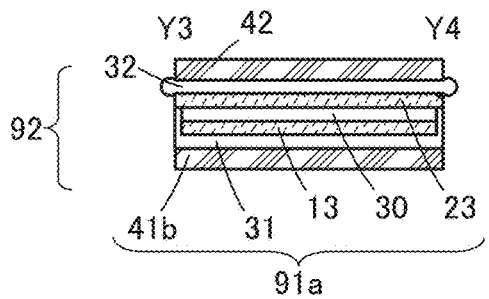
Figure 10E:
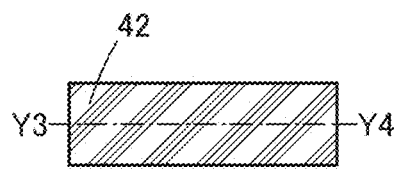

The second bonding unit 900 is supplied with the second remaining portion 91a and a second support body 42, and bonds the second support body 42 and the second remaining portion 91a to each other with a second bonding layer 32 (FIGS. 10D and 10E).

The second supply unit 600 also serving as the second unloading unit can be supplied with a stack body 92 including the second remaining portion 91a, the second bonding layer 32, and the second support body 42 and unload the stack body 92 (FIG. 8 and FIG. 10E).

The above stack body manufacturing apparatus in one embodiment of the present invention includes the first supply unit 100 that supplies the process member 90 and also serves as an unloading unit for unloading the stack body 91, the first separation unit 300 that separates the one surface layer 90b and the first remaining portion 90a of the process member 80 from each other, the first bonding unit 400 that bonds the first support body 41 to the first remaining portion 90a, the support body supply unit 500 that supplies the first support body 41 and the second support body 42, the second supply unit 600 that supplies the stack body 91 and unloads the stack body 92, the trigger formation unit 700 that forms the separation trigger, the second separation unit 800 that separates the one surface layer 91b and the second remaining portion 91a of the stack body 91 from each other, and the second bonding unit 900 that bonds the second support body 42 to the second remaining portion 91a. This structure makes it possible to separate the both surface layers of the process member 90 and bond the first support body 41 and the second support body 42 to the remaining portion. As described above, one embodiment of the present invention can provide an apparatus for manufacturing a stack body including a remaining portion of a process member and a pair of support bodies.

Furthermore, the stack body manufacturing apparatus 1000 in this embodiment includes a first storage portion 300b, a second storage portion 800b, a first cleaning device 350, a second cleaning device 850, a transport mechanism 111, a transport mechanism 112, and the like.

The first storage portion 300b stores the one surface layer 90b separated from the process member 90.

The second storage portion 800b stores the one surface layer 91b separated from the stack body 91.

The first cleaning device 350 cleans the first remaining portion 90a separated from the process member 90.

The second cleaning device 850 cleans the second remaining portion 91a separated from the stack body 91.

The transport mechanism 111 transports the process member 90, the first remaining portion 90a separated from the process member 90, and the stack body 91.

The transport mechanism 112 transports the stack body 91, the second remaining portion 91a separated from the stack body 91, and the stack body 92.

<<Stack Body Manufacturing Apparatus>>

Individual components of the stack body manufacturing apparatus in one embodiment of the present invention will be described below.

Note that the stack manufacturing apparatus 1000 differs from the stack manufacturing apparatus 1000A described in Embodiment 2 in including the second supply unit 600, the trigger formation unit 700, the second separation unit 800, the second bonding unit 900, the second storage portion 800b, and the second cleaning device 850. In this embodiment, a structure different from that of the stack manufacturing apparatus 1000A is described, and the description in Embodiment 2 is referred to for a structure common to that of the stack manufacturing apparatus 1000.

<Second Supply Unit>

The second supply unit 600 can have a structure similar to that of the first supply unit described in Embodiment 2 except that the second supply unit 600 is supplied with the stack body 91 and supplies the stack body 91 (i.e., is supplied with and supplies an object different from that of the first supply unit).

Furthermore, the second supply unit 600 in this embodiment also serves as the second unloading unit. The second unloading unit can have a structure similar to that of the first unloading unit described in Embodiment 2 except that the second unloading unit is supplied with the stack body 92 and unloads the stack body 92 (i.e., is supplied with and unloads an object different from that of the first unloading unit).

<Trigger Formation Unit>

The trigger formation unit 700 includes a cutting mechanism which cuts the first support body 41 and the first bonding layer 31 and separates part of the second layer 23 from the second separation layer 22, for example.

Specifically, the cutting mechanism includes one or a plurality of blades which has a sharp tip and a transfer mechanism which transfers the blade relatively to the stack body 91.

<Second Separation Unit>

The second separation unit 800 includes a mechanism for holding one surface layer of the stack body 91 and a mechanism for holding the other surface layer (corresponding to the second remaining portion 91a here) facing the one surface layer. One holding mechanism is pulled away from the other holding mechanism, whereby the one surface layer of the stack body 91 is separated to form the second remaining portion 91a.

<Second Bonding Unit>

The second bonding unit 900 includes the bonding apparatus in one embodiment of the present invention that is described as an example in Embodiment 1. The atmosphere in the second bonding unit 900 may be an air atmosphere or a reduced-pressure atmosphere. The second bonding unit 900 is preferably connected to an evacuation mechanism.

<Stack Body Manufacturing Method>

A method for manufacturing the stack body 92 from the process member 90 with the use of the stack body manufacturing apparatus 1000 will be described below with reference to FIG. 8, FIGS. 9A to 9E, and FIGS. 10A to 10E.

The process member 90 has the same structure as the process member 80 except that a first base includes a second substrate 21, the second separation layer 22 on the second substrate 21, and the second layer 23 whose one surface is in contact with the second separation layer 22.

Specifically, the process member 90 includes a first substrate 11, a first separation layer 12 on the first substrate 11, a first layer 13 whose one surface is in contact with the first separation layer 12, a bonding layer 30 whose one surface is in contact with the other surface of the first layer 13, the second layer 23 whose one surface is in contact with the other surface of the bonding layer 30, the second separation layer 22 whose one surface is in contact with the other surface of the second layer 23, and the second substrate 21 in contact with the other surface of the second separation layer 22 (FIG. 9A). Note that in this embodiment, description is given of a case of using the process member 90 in which separation triggers 13s are formed in advance near end portions of the bonding layer 30 (FIG. 9B). The structure of the process member 90 is described in detail in Embodiment 4.

<First Step>

The process member 90 is loaded into the first supply unit 100. The first supply unit 100 supplies the process member 90, and the transport mechanism 111 transports the process member 90 and supplies the process member 90 to the first separation unit 300.

<Second Step>

The first separation unit 300 separates the one surface layer 90b of the process member 90. Specifically, from the separation trigger 13s formed near the end portion of the bonding layer 30, the first substrate 11 and the first separation layer 12 are separated from the first layer 13 (FIG. 9C).

By this step, the first remaining portion 90a is obtained from the process member 90. Specifically, the first remaining portion 90a includes the first layer 13, the bonding layer 30 whose one surface is in contact with the first layer 13, the second layer 23 whose one surface is in contact with the other surface of the bonding layer 30, the second separation layer 22 whose one surface is in contact with the other surface of the second layer 23, and the second substrate 21 on the second separation layer 22.

<Third Step>

The transport mechanism 111 transports the first remaining portion 90a. The first cleaning device 350 cleans the first remaining portion 90a supplied thereto.

The transport mechanism 111 transports the first remaining portion 90a after the cleaning and supplies the first remaining portion 90a to the first bonding unit 400. The support body supply unit 500 supplies the first support body 41 to the first bonding unit 400.

The first bonding unit 400 forms the first bonding layer 31 over the first remaining portion 90a supplied thereto (FIG. 9D), and bonds the first remaining portion 90a and the first support body 41 to each other with the first bonding layer 31.

By this step, the stack body 91 is obtained using the first remaining portion 90a. Specifically, the stack body 91 includes the first support body 41, the first bonding layer 31, the first layer 13, the bonding layer 30 whose one surface is in contact with the first layer 13, the second layer 23 whose one surface is in contact with the other surface of the bonding layer 30, the second separation layer 22 whose one surface is in contact with the other surface of the second layer 23, and the second substrate 21 on the second separation layer 22 (FIG. 9E).

<Fourth Step>

The transport mechanism 111 transports the stack body 91, and the stack body 91 is supplied to the first supply unit 100 also serving as the first unloading unit.

After this step, the stack body 91 can be unloaded. For example, when it takes time to cure the first bonding layer 31, it is possible that the stack body 91 in which the first bonding layer 31 is not cured yet is unloaded and the first bonding layer 31 is cured outside the stack body manufacturing apparatus 1000. In that case, occupancy time of the apparatus can be reduced.

<Fifth Step>

The stack body 91 is loaded into the second supply unit 600. The second supply unit 600 supplies the stack body 91, and the transport mechanism 112 transports the stack body 91 and supplies the stack body 91 to the trigger formation unit 700.

<Sixth Step>

The trigger formation unit 700 forms the separation trigger 91s by separating, from the second separation layer 22, part of the second layer 23 near the end portion of the first bonding layer 31 of the stack body 91.

For example, the first support body 41 and the first bonding layer 31 are cut from the first support body 41 side, and part of the second layer 23 is separated from the second separation layer 22.

Specifically, the first bonding layer 31 and the first support body 41 in a region which is over the second separation layer 22 and in which the second layer 23 is provided are cut to draw a closed curve with a blade or the like including a sharp tip, and along the closed curve, the second layer 23 is partly separated from the second separation layer 22 (FIG. 10A).

By this step, the separation trigger 91s is formed in the cut portion near the end portions of the first support body 41b and the first bonding layer 31.

<Seventh Step>

The second separation unit 800 separates the one surface layer 91b of the stack body 91. Specifically, from the separation trigger 91s formed near the end portion of the first bonding layer 31, the second substrate 21 and the second separation layer 22 are separated from the second layer 23 (FIG. 10B).

By this step, the second remaining portion 91a is obtained from the stack body 91. Specifically, the second remaining portion 91a includes the first support body 41b, the first bonding layer 31, the first layer 13, the bonding layer 30 whose one surface is in contact with the first layer 13, and second layer 23 whose one surface is in contact with the other surface of the bonding layer 30.

<Eighth Step>

The transport mechanism 112 transports the second remaining portion 91a, and turns the second remaining portion 91a so that the second layer 23 faces upward (FIG. 10C). The second cleaning device 850 cleans the second remaining portion 91a separated thereto.

The transport mechanism 112 transports the second remaining portion 91a after the cleaning and supplies the second remaining portion 91a to the second bonding unit 900. The support body supply unit 500 supplies the second support body 42 to the second bonding unit 900.

Note that the transport mechanism 112 may supply the second remaining portion 91a from the second separation unit 800 directly to the second bonding unit 900 without supplying it to the cleaning device.

The second bonding unit 900 forms the second bonding layer 32 over the second remaining portion 91a supplied thereto (FIG. 10D), and bonds the second remaining portion 91a and the second support body 42 to each other with the second bonding layer 32 (FIG. 10E).

By this step, the stack body 92 is obtained using the second remaining portion 91a. Specifically, the stack body 92 includes the first layer 13, the first bonding layer 31, the first support body 41b, the bonding layer 30, the second layer 23, and the second support body 42.

<Ninth Step>

The transport mechanism 112 transports the stack body 92, and the stack body 92 is supplied to the second supply unit 600 also serving as the second unloading unit.

After this step, the stack body 92 can be unloaded.

Modification Example

A modification example of this embodiment is described with reference to FIG. 11.

Figure 11:
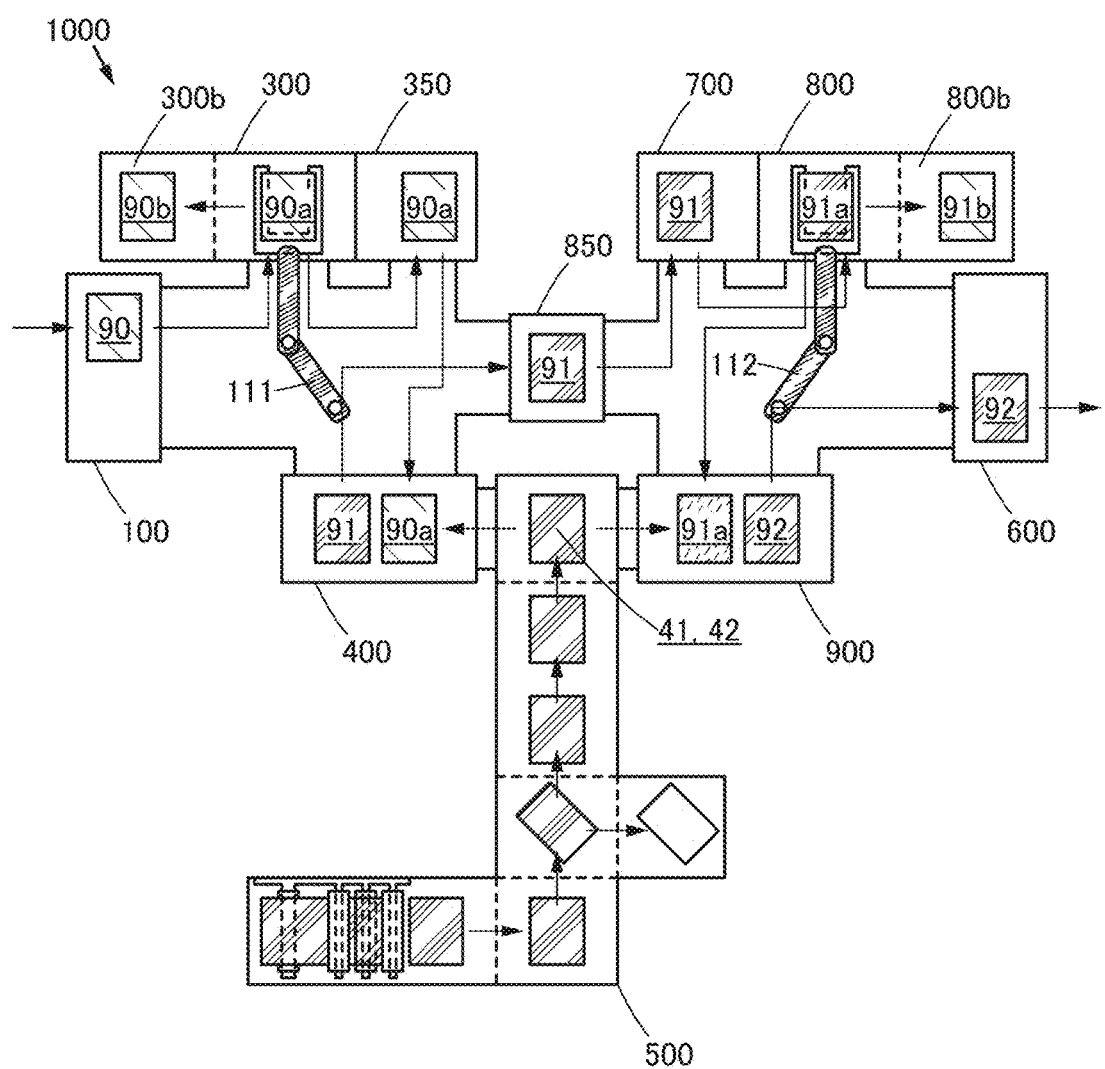
FIG. 11 illustrates a stack body manufacturing apparatus.

FIG. 11 is a schematic view illustrating a structure of a stack body manufacturing apparatus 1000 in one embodiment of the present invention, and a transport path of a process member and a stack body in a process.

In the modification example of this embodiment, a method for manufacturing the stack body 92 from the process member 90 with the use of the stack body manufacturing apparatus 1000, which is different from the above-described method, is described with reference to FIGS. 9A to 9E, FIGS. 10A to 10E, and FIG. 11.

Specifically, the differences between the method in this modification example and the above-described method are as follows: in the fourth step, the transport mechanism 111 transports the stack body 91 and the stack body 91 is supplied not to the first supply unit 100 also serving as the first unloading unit but to the second cleaning device 850; in the fifth step, the transport mechanism 112 transports the stack body 91 and the stack body 91 is supplied to the trigger formation unit 700; and in the eighth step, the second remaining portion 91a is directly supplied to the second bonding unit 900 without being supplied to the second cleaning device 850. Thus, different portions will be described in detail below. Refer to the above description for portions where the same methods can be employed.

Modification Example of Fourth Step

The transport mechanism 111 transports the stack body 91 and the stack body 91 is supplied to the second cleaning device 850.

In the modification example of this embodiment, the second cleaning device 850 is used as a delivery chamber in which the transport mechanism 111 delivers the stack body 91 to the transport mechanism 112 (FIG. 11).

By this step, the stack body 91 can be continuously processed without being unloaded from the stack body manufacturing apparatus 1000. The stack body manufacturing apparatus 1000 may include a delivery chamber separately. In that case, the second remaining portion 91a can be cleaned in the second cleaning device 850 and the stack body 91 can be delivered via the delivery chamber at the same time.

Modification Example of Fifth Step

The transport mechanism 112 transports the stack body 91, and the stack body 91 is supplied to the trigger formation unit 700.

Modification Example of Eighth Step

The transport mechanism 112 transports the second remaining portion 91a, and turns the second remaining portion 91a so that the second layer 23 faces upward. The second remaining portion 91a is supplied to the second bonding unit 900.

The second bonding unit 900 forms the second bonding layer 32 over the second remaining portion 91a supplied thereto (FIG. 9D), and bonds the second remaining portion 91a and the second support body 42 to each other with the second bonding layer 32 (FIG. 9E).

By this step, the stack body 92 is obtained using the second remaining portion 91a.

This embodiment can be combined with any of the other embodiments in this specification as appropriate.

Embodiment 4

In this embodiment, a process member which can be used in the stack body manufacturing apparatus in one embodiment of the present invention will be described with reference to FIGS. 12A and 12B.

Figure 12A:
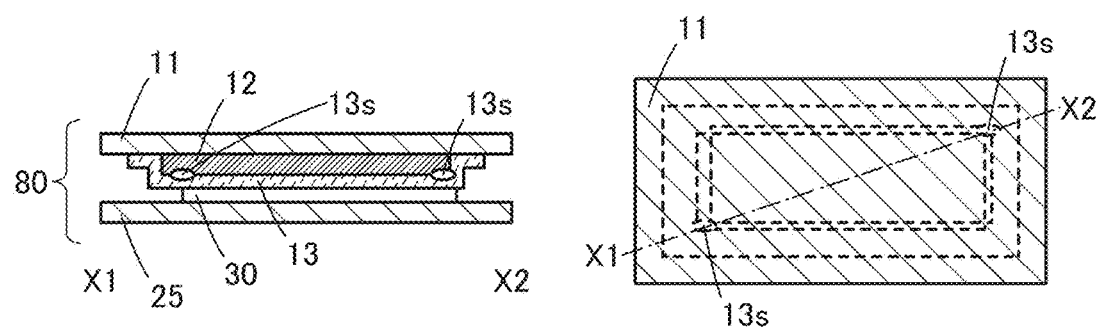
FIGS. 12A and 12B illustrate a stack body manufacturing process.
Figure 12B:
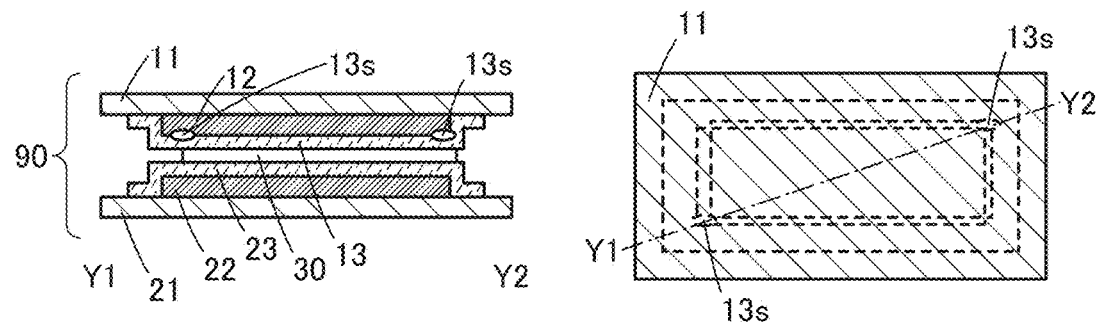

FIGS. 12A and 12B are schematic views illustrating structures of process members that can be used to form a stack body with the use of the stack body manufacturing apparatus in one embodiment of the present invention.

FIG. 12A illustrates a plan view of a structure of the process member 80 and a cross-sectional view taken along dashed-dotted line X1-X2 in the plan view.

FIG. 12B illustrates a plan view of a structure of the process member 90 and a cross-sectional view taken along dashed-dotted line Y1-Y2 in the plan view.

<<Example 1 of Process Member>>

The process member 80 illustrated in FIG. 12A includes the first substrate 11, the first separation layer 12 on the first substrate 11, a first layer 13 whose one surface is in contact with the first separation layer 12, a bonding layer 30 whose one surface is in contact with the other surface of the first layer 13, a base 25 in contact with the other surface of the bonding layer 30.

Note that the separation triggers 13s may be provided near the end portions of the bonding layer 30.

<First Substrate>

There is no particular limitation on the first substrate 11 as long as the first substrate 11 has heat resistance high enough to withstand a manufacturing process and a thickness and a size which can be used in a manufacturing apparatus.

Examples of materials that can be used for the first substrate 11 include glass, ceramics, metal, an inorganic material, and a resin.

Specific examples of glass include non-alkali glass, soda-lime glass, potash glass, crystal glass, and the like. Examples of metals include SUS, aluminum, and the like.

The structure of the first substrate 11 is not limited to a single-layer structure and may be a stacked-layer structure. For example, a base and an insulating layer which prevents impurity diffusion from the base may be stacked. Specifically, a structure can be employed, in which glass and any of a variety of base layers which prevents impurity diffusion from glass, such as a silicon oxide layer, a silicon nitride layer, a silicon oxynitride layer, are stacked.

<First Separation Layer>

There is no particular limitation on the first separation layer 12 as long as the first separation layer 12 can be used to separate the first layer 13 formed thereon and has heat resistance high enough to withstand the manufacturing process.

Examples of materials that can be used for the first separation layer 12 include an inorganic material, an organic material, and the like.

Specific examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon.

Specific examples of the organic material include polyimide, polyester, polyolefin, polyamide, polycarbonate, an acrylic resin, and the like.

The first separation layer 12 may have a single-layer structure or a stacked-layer structure. For example, a structure in which a layer containing tungsten and a layer containing an oxide of tungsten are stacked can be used.

The layer containing an oxide of tungsten may be formed by stacking another layer with a layer containing tungsten; for example, the layer containing an oxide of tungsten may be formed by stacking a film containing oxygen, such as a silicon oxide film or a silicon oxynitride film, over a layer containing tungsten.

The layer containing an oxide of tungsten may be formed by performing thermal oxidation treatment, oxygen plasma treatment, nitrous oxide ($N_2O$) plasma treatment, treatment with a solution having strong oxidizing power (e.g., ozone water), or the like on a surface of a layer containing tungsten.

<First Layer>

There is no particular limitation on the first layer 13 as long as the first layer 13 can be separated from the first separation layer 12 and has heat resistance high enough to withstand the manufacturing process.

Examples of materials that can be used for the first layer 13 include an inorganic material, an organic material, and the like.

The first layer 13 may have a single-layer structure or a stacked-layer structure. For example, a structure may be employed in which a functional layer that overlaps with the first separation layer 12 and an insulating layer that is provided between the first separation layer 12 and the functional layer to prevent diffusion of impurities which impair the characteristics of the functional layer are stacked. Specifically, a structure can be employed in which a silicon oxynitride layer, a silicon nitride layer, and the functional layer are stacked in this order over the first separation layer 12.

The functional layer that can be used for the first layer 13 includes at least one of a functional circuit, a functional element, an optical element, a functional film, and the like, for example. Specifically, a structure can be employed which includes at least one of a pixel circuit of a display device, a pixel driver circuit, a display element, a color filter, a moisture-proof film, and the like.

<Bonding Layer>

There is no particular limitation on the bonding layer 30 as long as the bonding layer 30 bonds the first layer 13 and the base 25 to each other.

Examples of materials that can be used for the bonding layer 30 include an inorganic material, an organic material, and the like.

Specifically, a glass layer with a melting point of 400° C. or lower, preferably 300° C. or lower, an adhesive, or the like can be used.

Examples of the adhesive that can be used for the bonding layer 30 include a light curable adhesive such as a UV curable adhesive, a reactive curable adhesive, a heat curable adhesive, and an anaerobic adhesive.

Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin.

<Base>

There is no particular limitation on the base 25 as long as the base 25 has heat resistance high enough to withstand a manufacturing process and a thickness and a size which can be used in a manufacturing apparatus.

A material used for the base 25 can be similar to that used for the first substrate 11, for example.

<Separation Trigger>

In the process member 80, the separation triggers 13s may be provided near the end portions of the bonding layer 30. In the case where the end portions of the bonding layer do not overlap with the separation layer, separation triggers may be provided near end portions of the separation layer.

The separation triggers 13s are formed by separating part of the first layer 13 from the first separation layer 12.

The separation triggers 13s can be formed by inserting a sharp tip into the first layer 13; alternatively, the separation triggers 13s can be formed by separating part of the first layer 13 from the first separation layer 12 by a noncontact method using a laser or the like (e.g., a laser ablation method).

<<Example 2 of Process Member>>

The process member 90 illustrated in FIG. 12B includes the second substrate 21, the second separation layer 22 over the second substrate 21, and the second layer 23 whose other surface is in contact with the second separation layer 22 instead of the base 25 of the process member 80, and differs in that one surface of the second layer 23 is in contact with the other surface of the bonding layer 30. Thus, different portions will be described in detail below. Refer to the above description for similar components.

<Second Substrate>

As the second substrate 21, the same substrate as the first substrate 11 can be used. Note that the second substrate 21 and the first substrate 11 do not need to have the same structure.

<Second Separation Layer>

As the second separation layer 22, the same layer as the first separation layer 12 can be used. Note that the second separation layer 22 and the first separation layer 12 do not need to have the same structure.

<Second Layer>

As the second layer 23, the same layer as the first layer 13 can be used. Alternatively, the second layer 23 can have a structure different from that of the first layer 13.

For example, a structure may be employed in which the first layer 13 includes a functional circuit and the second layer 23 includes a functional layer that prevents diffusion of impurities into the functional circuit.

Specifically, a structure may be employed in which the first layer 13 includes a pixel circuit of a display device, a driver circuit of the pixel circuit, and a light-emitting element that is connected to the pixel circuit and emits light toward the second layer 23, and the second layer 23 includes a color filter and a moisture-proof film.

This embodiment can be combined with any of the other embodiments in this specification as appropriate.

Embodiment 5

In this embodiment, examples of flexible light-emitting devices which can be manufactured using the bonding apparatus in one embodiment of the present invention or the stack body manufacturing apparatus in one embodiment of the present invention will be described.

Specific Example 1

Figure 13A:
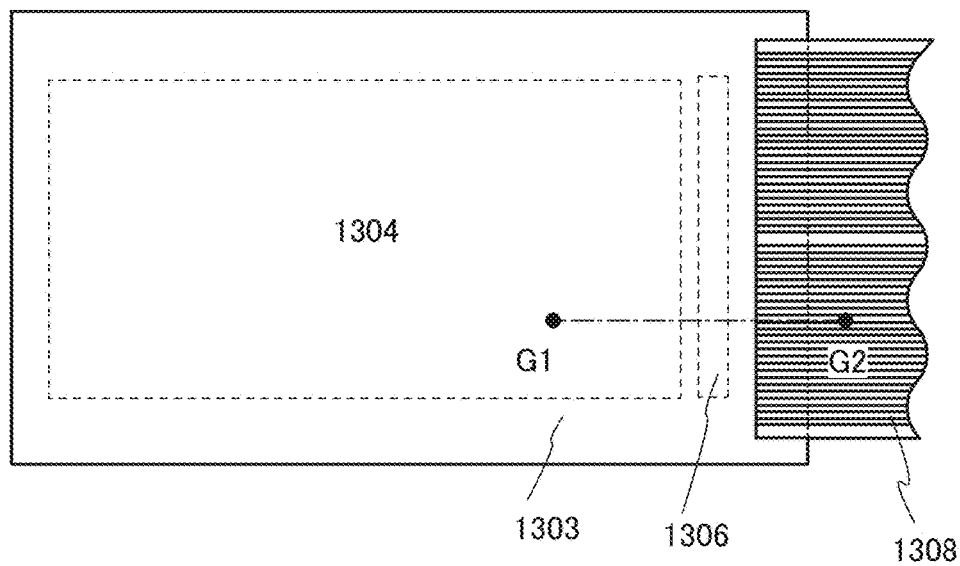
FIGS. 13A and 13B illustrate a light-emitting device.
Figure 13B:
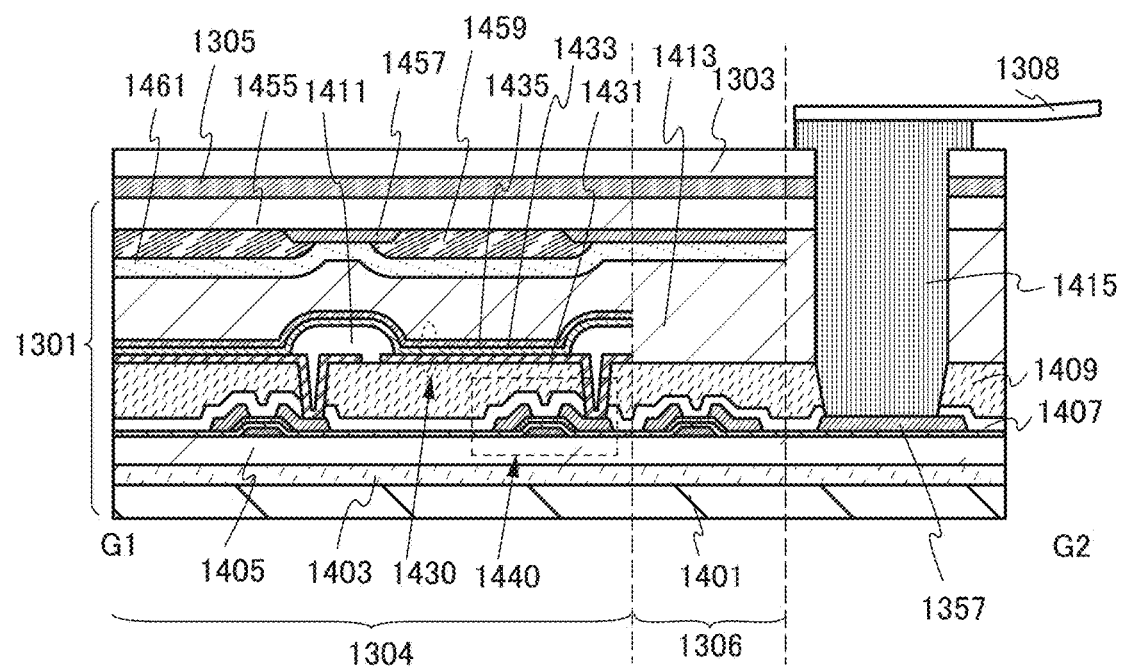
Figure 20A:
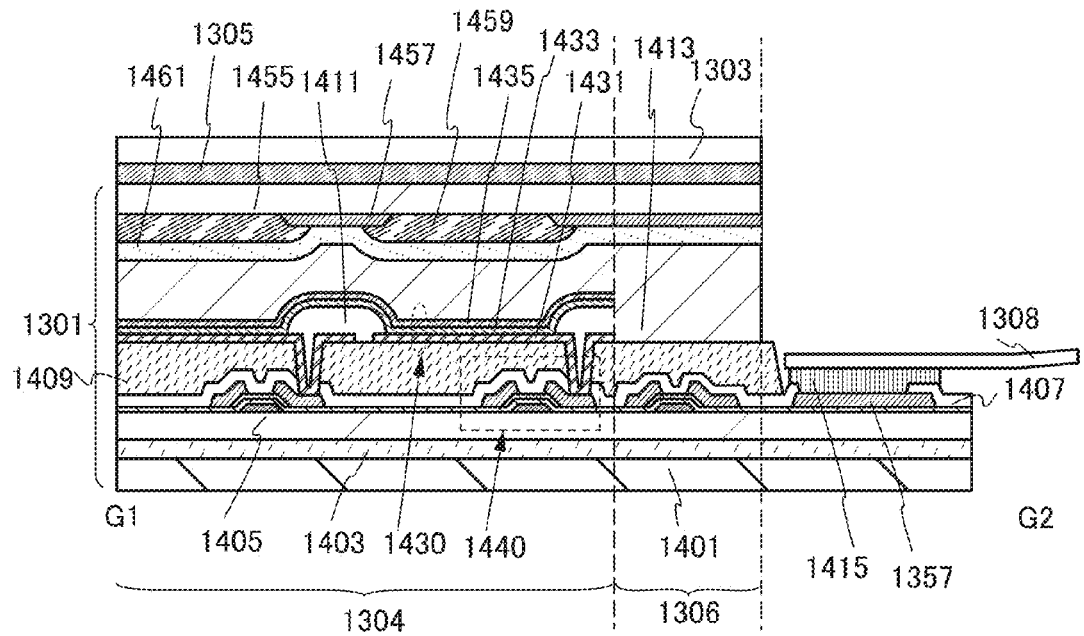
FIGS. 20A and 20B illustrate a light-emitting device.
Figure 20B:
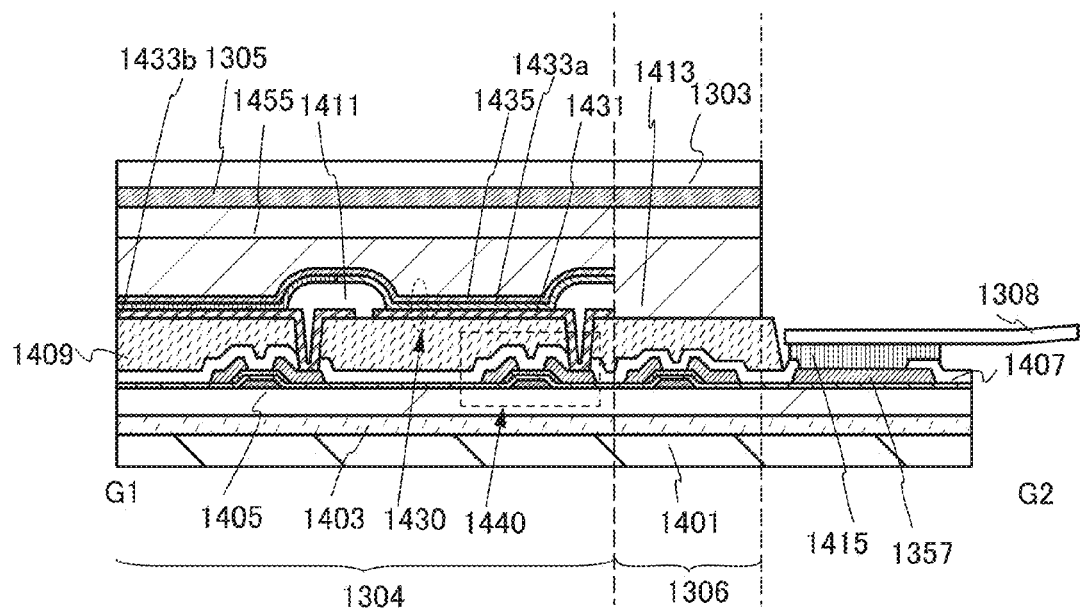

FIG. 13A is a plan view of a flexible light-emitting device, and FIGS. 13B, 20A, and 20B are each an example of a cross-sectional view taken along dashed-dotted line G1-G2 in FIG. 13A.

The light-emitting device illustrated in FIG. 13B, 20A, or 20B includes an element layer 1301, a bonding layer 1305, and a substrate 1303. The element layer 1301 includes a substrate 1401, a bonding layer 1403, an insulating layer 1405, a plurality of transistors, a conductive layer 1357, an insulating layer 1407, an insulating layer 1409, a plurality of light-emitting elements, an insulating layer 1411, a sealing layer 1413, an insulating layer 1461, a coloring layer 1459, a light-blocking layer 1457, and an insulating layer 1455.

The conductive layer 1357 is electrically connected to an FPC 1308 via a connector 1415.

A light-emitting element 1430 includes a lower electrode 1431, an EL layer 1433, and an upper electrode 1435. The lower electrode 1431 is electrically connected to a source electrode or a drain electrode of a transistor 1440. An end portion of the lower electrode 1431 is covered with the insulating layer 1411. The light-emitting element 1430 has a top emission structure. The upper electrode 1435 has a light-transmitting property and transmits light emitted from the EL layer 1433.

The coloring layer 1459 is provided to overlap with the light-emitting element 1430, and the light-blocking layer 1457 is provided to overlap with the insulating layer 1411. The coloring layer 1459 and the light-blocking layer 1457 are covered with the insulating layer 1461. The space between the light-emitting element 1430 and the insulating layer 1461 is filled with the sealing layer 1413.

The light-emitting element 1430 which does not overlap with the coloring layer 1459 may be provided as illustrated in FIG. 20B. For example, in the case where one pixel includes four sub-pixels which are red, blue, green, and white sub-pixels, the coloring layer 1459 is not necessarily provided in the white sub-pixel. Accordingly, the amount of light absorbed by the coloring layer can be reduced, and thus, the power consumption of the light-emitting device can be reduced. With the use of different materials for an EL layer 1433a and an EL layer 1433b, light-emitting elements exhibiting different colors may be manufactured in pixels.

The light-emitting device includes a plurality of transistors in a light extraction portion 1304 and a driver circuit portion 1306. The transistor 1440 is provided over the insulating layer 1405. The insulating layer 1405 and the substrate 1401 are bonded to each other with the bonding layer 1403. The insulating layer 1455 and the substrate 1303 are bonded to each other with the bonding layer 1305. It is preferable to use insulating films with low moisture permeability for the insulating layer 1405 and the insulating layer 1455, in which case an impurity such as moisture or oxygen can be prevented from entering the light-emitting element 1430 or the transistor 1440, leading to improved reliability of the light-emitting device.

The light-emitting device in the specific example 1 can be manufactured in the following manner, the insulating layer 1405, the transistor 1440, and the light-emitting element 1430 are formed over a formation substrate with high heat resistance; the formation substrate is separated; and the insulating layer 1405, the transistor 1440, and the light-emitting element 1430 are transferred to the substrate 1401 and bonded thereto with the bonding layer 1403. The light-emitting device in the specific example 1 can be manufactured in the following manner: the insulating layer 1455, the coloring layer 1459, and the light-blocking layer 1457 are formed over a formation substrate with high heat resistance; the formation substrate is separated; and the insulating layer 1455, the coloring layer 1459, and the light-blocking layer 1457 are transferred to the substrate 1303 and bonded thereto with the bonding layer 1305.

In the case where a material with high moisture permeability and low heat resistance (e.g. resin) is used for a substrate, it is not allowed to expose the substrate to high temperature in the manufacturing process. Thus, there is a limitation on conditions for forming a transistor and an insulating film over the substrate. In the manufacturing method of this embodiment, a transistor and the like can be formed over a formation substrate having high heat resistance; thus, a highly reliable transistor and an insulating film with sufficiently low moisture permeability can be formed. Then, the transistor and the insulating film are transferred to the substrate 1303 or the substrate 1401, whereby a highly reliable light-emitting device can be manufactured. Thus, with one embodiment of the present invention, a thin and/or lightweight light-emitting device with high reliability can be provided. Details of the manufacturing method will be described later.

The substrate 1303 and the substrate 1401 are each preferably formed using a material with high toughness. In that case, a display device with high impact resistance that is less likely to be broken can be provided. For example, when the substrate 1303 is an organic resin substrate and the substrate 1401 is a substrate of a thin metal material or a thin alloy material, the light-emitting device can be lightweight and unlikely to be broken as compared with the case where a glass substrate is used.

A metal material and an alloy material, which have high thermal conductivity, are preferred because they can easily conduct heat to the whole substrate and accordingly can prevent a local temperature rise in the light-emitting device. The thickness of a substrate using a metal material or an alloy material is preferably greater than or equal to 10 μm and less than or equal to 200 μm, further preferably greater than or equal to 20 μm and less than or equal to 50 μm.

Furthermore, when a material with high thermal emissivity is used for the substrate 1401, the surface temperature of the light-emitting device can be prevented from rising, leading to prevention of breakage or a decrease in reliability of the light-emitting device. For example, the substrate 1401 may have a stacked structure of a metal substrate and a layer with high thermal emissivity (the layer can be formed using a metal oxide or a ceramic material, for example).

Specific Example 2

Figure 14A:
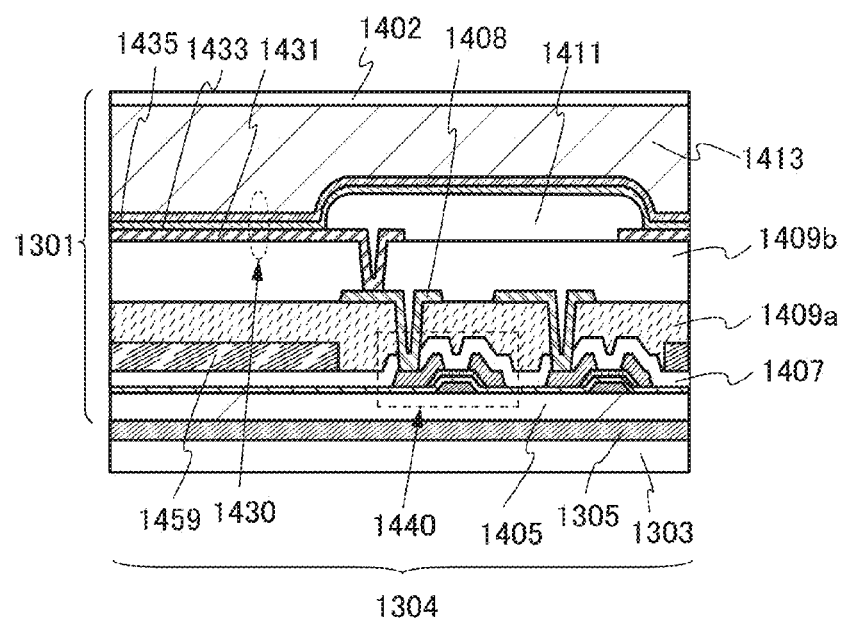
FIGS. 14A and 14B illustrate a light-emitting device.

FIG. 14A illustrates another example of the light extraction portion 1304 in the light-emitting device.

The light extraction portion 1304 illustrated in FIG. 14A includes a substrate 1303, a bonding layer 1305, a substrate 1402, an insulating layer 1405, a plurality of transistors, an insulating layer 1407, a conductive layer 1408, an insulating layer 1409a, an insulating layer 1409b, a plurality of light-emitting elements, an insulating layer 1411, a sealing layer 1413, and a coloring layer 1459.

A light-emitting element 1430 includes a lower electrode 1431, an EL layer 1433, and an upper electrode 1435. The lower electrode 1431 is electrically connected to a source electrode or a drain electrode of a transistor 1440 through the conductive layer 1408. An end portion of the lower electrode 1431 is covered with the insulating layer 1411. The light-emitting element 1430 has a bottom emission structure. The lower electrode 1431 has a light-transmitting property and transmits light emitted from the EL layer 1433.

The coloring layer 1459 is provided to overlap with the light-emitting element 1430, and light emitted from the light-emitting element 1430 is extracted from the substrate 1303 side through the coloring layer 1459. The space between the light-emitting element 1430 and the substrate 1402 is filled with the sealing layer 1413. The substrate 1402 can be formed using a material similar to that of the substrate 1401.

Specific Example 3

Figure 14B:
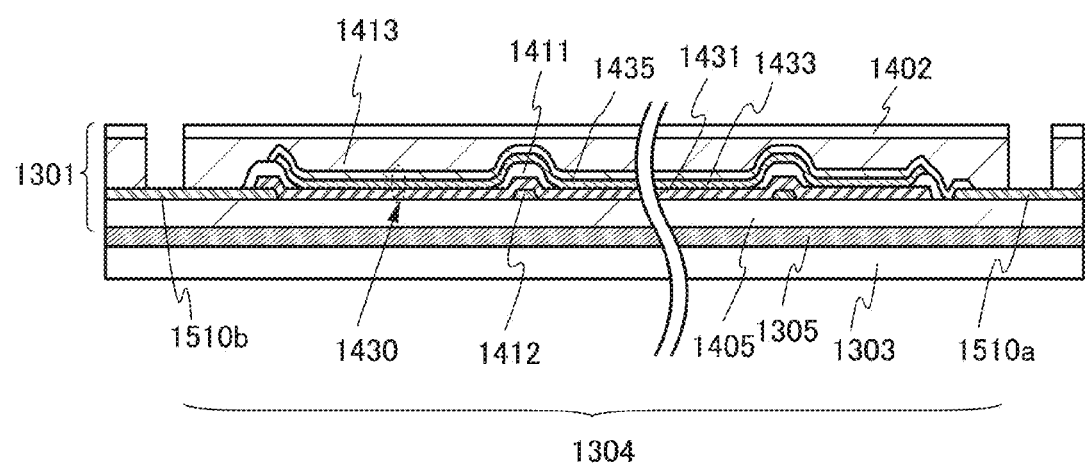

FIG. 14B illustrates another example of a light-emitting device.

The light-emitting device illustrated in FIG. 14B includes an element layer 1301, a bonding layer 1305, and a substrate 1303. The element layer 1301 includes a substrate 1402, an insulating layer 1405, a conductive layer 1510a, a conductive layer 1510b, a plurality of light-emitting elements, an insulating layer 1411, a conductive layer 1412, and a sealing layer 1413.

The conductive layer 1510a and the conductive layer 1510b, which are external connection electrodes of the light-emitting device, can each be electrically connected to an FPC or the like.

A light-emitting element 1430 includes a lower electrode 1431, an EL layer 1433, and an upper electrode 1435. An end portion of the lower electrode 1431 is covered with the insulating layer 1411. The light-emitting element 1430 has a bottom emission structure. The lower electrode 1431 has a light-transmitting property and transmits light emitted from the EL layer 1433. The conductive layer 1412 is electrically connected to the lower electrode 1431.

The substrate 1303 may have, as a light extraction structure, a hemispherical lens, a micro lens array, a film provided with an uneven surface structure, a light diffusing film, or the like. For example, the light extraction structure can be formed by bonding the above lens or film to a resin substrate with an adhesive or the like having substantially the same refractive index as the substrate or the lens or film.

The conductive layer 1412 is preferably, though not necessarily, provided because voltage drop due to the resistance of the lower electrode 1431 can be prevented. In addition, for a similar purpose, a conductive layer electrically connected to the upper electrode 1435 may be provided over the insulating layer 1411.

The conductive layer 1412 can be a single layer or a stacked layer formed using a material selected from copper, titanium, tantalum, tungsten, molybdenum, chromium, neodymium, scandium, nickel, or aluminum or an alloy material containing any of these materials as its main component. The thickness of the conductive layer 1412 can be greater than or equal to 0.1 µm and less than or equal to 3 µm, preferably greater than or equal to 0.1 µm and less than or equal to 0.5 µm.

When a paste (e.g., silver paste) is used as a material for the conductive layer electrically connected to the upper electrode 1435, metal particles forming the conductive layer aggregate; therefore, the surface of the conductive layer is rough and has many gaps. Thus, it is difficult for the EL layer 1433 to completely cover the conductive layer; accordingly, the upper electrode and the conductive layer are electrically connected to each other easily, which is preferable.

Examples of Materials

Next, materials and the like that can be used for a light-emitting device are described. Note that description on the components already described in this embodiment is omitted.

The element layer 1301 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 1301 may further include a transistor for driving the light-emitting element, a touch sensor, or the like.

The structure of the transistors in the light-emitting device is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the state of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is particularly preferable that a semiconductor having crystallinity be used, in which case deterioration of the transistor characteristics can be suppressed.

The light-emitting element included in the light-emitting device includes a pair of electrodes (the lower electrode 1431 and the upper electrode 1435), and the EL layer 1433 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Further, lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Further, when a metal film or a metal oxide film is stacked on and in contact with an aluminum alloy film, oxidation of the aluminum alloy film can be prevented. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 1431 and the upper electrode 1435, holes are injected to the EL layer 1433 from the anode side and electrons are injected to the EL layer 1433 from the cathode side. The injected electrons and holes are recombined in the EL layer 1433 and a light-emitting substance contained in the EL layer 1433 emits light.

The EL layer 1433 includes at least a light-emitting layer. In addition to the light-emitting layer, the EL layer 1433 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 1433, either a low molecular compound or a high molecular compound can be used, and an inorganic compound may also be used. Each of the layers included in the EL layer 1433 can be formed by any of the following methods: an evaporation method (including a vacuum evaporation method), a transfer method, a printing method, an inkjet method, a coating method, and the like.

In the element layer 1301, the light-emitting element is preferably provided between a pair of insulating films with low moisture permeability. In that case, an impurity such as water can be prevented from entering the light-emitting element, leading to prevention of a decrease in the reliability of the light-emitting device.

As an insulating film with low moisture permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low moisture permeability is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-8}$ [g/m$^2$·day].

The substrate 1303 has a light-transmitting property and transmits at least light emitted from the light-emitting element included in the element layer 1301. The substrate 1303 has flexibility. The refractive index of the substrate 1303 is higher than that of the air.

An organic resin, which is lighter than glass, is preferably used for the substrate 1303, in which case the light-emitting device can be lightweight as compared with the case where glass is used.

Examples of materials having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 1303 may have a stacked structure of a layer of any of the above-mentioned materials and a hard coat layer (e.g., a silicon nitride layer) which protects a surface of the light-emitting device from damage or the like, a layer (e.g., an aramid resin layer) which can disperse pressure, or the like. Furthermore, to suppress a decrease in the lifetime of the light-emitting element due to moisture and the like, the insulating film with low moisture permeability may be provided.

The bonding layer 1305 has a light-transmitting property and transmits at least light emitted from the light-emitting element included in the element layer 1301. The refractive index of the bonding layer 1305 is higher than that of the air.

For the bonding layer 1305, a curable resin that is curable at room temperature (e.g., a two-component-mixture-type resin), a light curable resin, a heat curable resin, or the like can be used. Examples include an epoxy resin, an acrylic resin, a silicone resin, a phenol resin, and the like. In particular, a material with low moisture permeability, such as an epoxy resin, is preferred.

Further, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The bonding layer 1305 may also include a scattering member for scattering light. For example, the bonding layer 1305 can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, a silicone resin, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

A material similar to that of the bonding layer 1305 can be used for the bonding layer 1403. In the case where the bonding layer 1403 is provided on the side where light emitted from the light-emitting element is not extracted, there is no limitation on the light-transmitting property or the refractive index of the bonding layer 1403.

The insulating layer 1405 and the insulating layer 1455 can each be formed using an inorganic insulating material. It is particularly preferable to use the insulating film with low moisture permeability, in which case a highly reliable light-emitting device can be provided.

The insulating layer 1407 has an effect of preventing diffusion of impurities into a semiconductor included in the transistor. As the insulating layer 1407, an inorganic insulating film such as a silicon oxide film, a silicon oxynitride film, or an aluminum oxide film can be used.

As each of the insulating layers 1409, 1409a, and 1409b, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that a plurality of any of insulating films formed of these materials and inorganic insulating films may be stacked.

The insulating layer 1411 is provided to cover an end portion of the lower electrode 1431. In order that the insulating layer 1411 be favorably covered with the EL layer 1433 and the upper electrode 1435 formed thereover, a side wall of the insulating layer 1411 preferably has a tilted surface with continuous curvature.

As a material for the insulating layer 1411, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 1411.

There is no particular limitation on the method for forming the insulating layer 1411; a photolithography method, a sputtering method, an evaporation method, a droplet discharging method (e.g., an inkjet method), a printing method (e.g. a screen printing method or an off-set printing method), or the like may be used.

For the sealing layer 1413, a curable resin that is curable at room temperature (e.g., a two-component-mixture-type resin), a light curable resin, a heat curable resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. The sealing layer 1413 may include a drying agent. In the case where light emitted from the light-emitting element 1430 is extracted outside through the sealing layer 1413, the sealing layer 1413 preferably includes a filler with a high refractive index or a scattering member. Materials for the drying agent, the filler with a high refractive index, and the scattering member are similar to those that can be used for the bonding layer 1305.

The conductive layer 1357 can be formed using the same material and the same step as a conductive layer included in the transistor or the light-emitting element. For example, the conductive layer can be formed to have a single-layer structure or a stacked-layer structure using any of metal materials such as molybdenum, titanium, chromium, tantalum, tungsten, aluminum, copper, neodymium, and scandium, and an alloy material containing any of these elements. The conductive layer may be formed using a conductive metal oxide. As the conductive metal oxide, indium oxide (e.g., $In_2O_3$), tin oxide (e.g., $SnO_2$), zinc oxide (ZnO), indium tin oxide (ITO), indium zinc oxide (e.g., $In_2O_3$—ZnO), or any of these metal oxide materials in which silicon oxide is contained can be used.

Each of the conductive layers 1408, 1412, 1510a, and 1510b can also be formed using any of the above metal materials, alloy materials, and conductive metal oxides.

For the connector 1415, it is possible to use a paste-like or sheet-like material which is obtained by mixture of metal particles and a heat-curable resin and for which anisotropic electric conductivity is provided by thermocompression bonding. As the metal particles, particles in which two or more kinds of metals are layered, for example, nickel particles coated with gold, are preferably used.

The coloring layer 1459 is a coloring layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 1457 is provided between the adjacent coloring layers 1459. The light-blocking layer 1457 blocks light emitted from the adjacent light-emitting element, thereby preventing color mixture between adjacent pixels. Here, the coloring layer 1459 is provided such that its end portion overlaps with the light-blocking layer 1457, whereby light leakage can be prevented. The light-blocking layer 1457 can be formed using a material that blocks light emitted from the light-emitting element, for example, a metal material, a resin material including a pigment or a dye, or the like. Note that as illustrated in FIG. 13B, the light-blocking layer 1457 is preferably provided also in a region other than the light extraction portion 1304, such as the driver circuit portion 1306, in which case undesired leakage of guided light or the like can be prevented.

The insulating layer 1461 covering the coloring layer 1459 and the light-blocking layer 1457 is preferably provided because it can prevent an impurity such as a pigment included in the coloring layer 1459 or the light-blocking layer 1457 from diffusing into the light-emitting element or the like. For the insulating layer 1461, a light-transmitting material is used, and an inorganic insulating material or an organic insulating material can be used. The insulating film with low moisture permeability may be used for the insulating layer 1461.

<Example of Manufacturing Method>

Next, an example of a method for manufacturing a light-emitting device will be described with reference to FIGS. 15A to 15C and FIGS. 16A to 16C. Here, the manufacturing method is described using the light-emitting device of the specific example 1 (FIG. 13B) as an example.

Figure 15A:
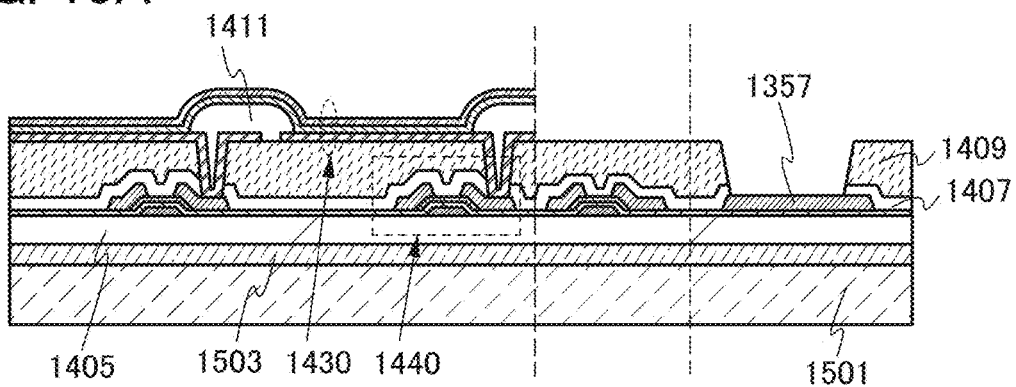
FIGS. 15A to 15C illustrate a method for manufacturing a light-emitting device.

First, a separation layer 1503 is formed over a formation substrate 1501, and the insulating layer 1405 is formed over the separation layer 1503. Next, the plurality of transistors, the conductive layer 1357, the insulating layer 1407, the insulating layer 1409, the plurality of light-emitting elements, and the insulating layer 1411 are formed over the insulating layer 1405. An opening is formed in the insulating layers 1411, 1409, and 1407 to expose the conductive layer 1357 (FIG. 15A).

Figure 15B:
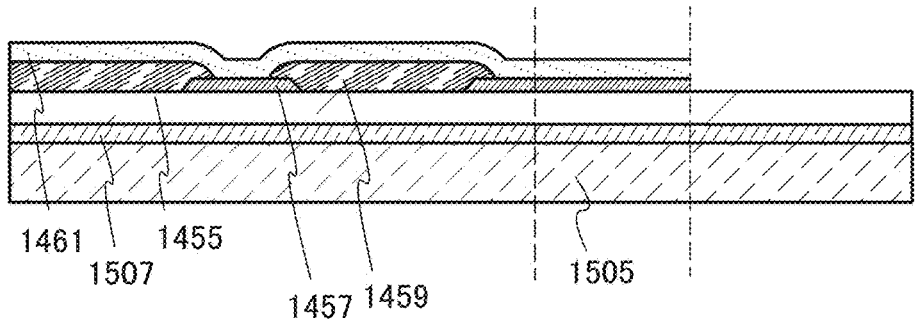

In addition, a separation layer 1507 is formed over a formation substrate 1505, and the insulating layer 1455 is formed over the separation layer 1507. Next, the light-blocking layer 1457, the coloring layer 1459, and the insulating layer 1461 are formed over the insulating layer 1455 (FIG. 15B).

The formation substrate 1501 and the formation substrate 1505 can each be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. When the temperature of heat treatment performed later is high, a substrate having a strain point of 730° C. or higher is preferably used. Alternatively, crystallized glass or the like may be used.

In the case where a glass substrate is used as the above formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 1503 and the separation layer 1507 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating layer formed later can be controlled.

Each of the insulating layers can be formed by a sputtering method, a plasma CVD method, a coating method, a printing method, or the like. For example, the insulating layer is formed at a temperature of higher than or equal to 250° C. and lower than or equal to 400° C. by a plasma CVD method, whereby the insulating layer can be a dense film with very low moisture permeability.

Figure 15C:
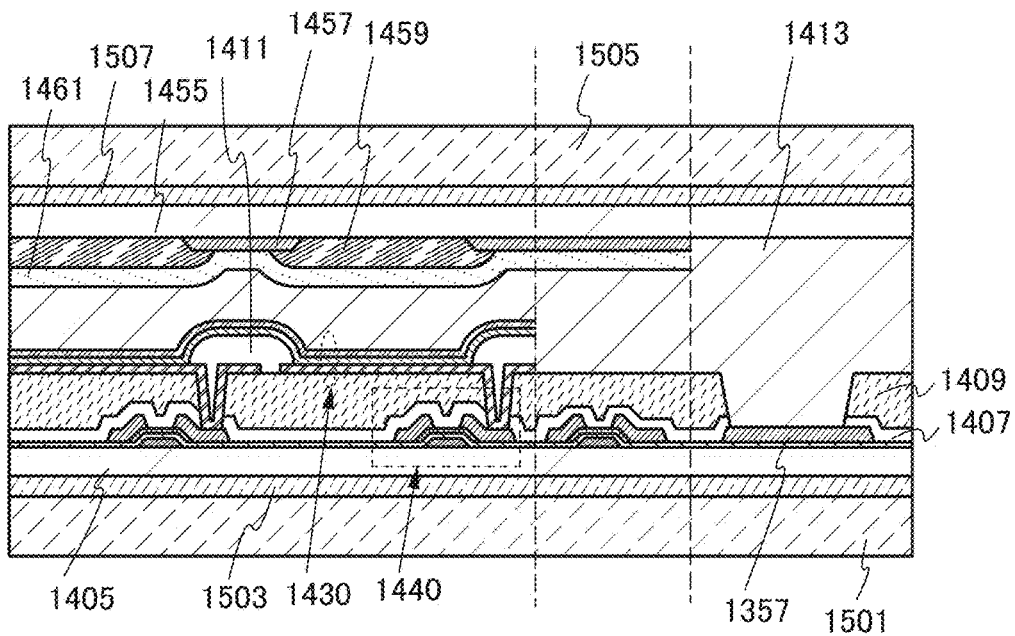

Then, a material for the bonding layer 1413 is applied to a surface of the formation substrate 1505 over which the coloring layer 1459 and the like are formed or a surface of the formation substrate 1501 over which the light-emitting element 1430 and the like are formed, and the surfaces are bonded to each other with the bonding layer 1413 positioned therebetween (FIG. 15C).

Next, the formation substrate 1501 is separated, and the exposed insulating layer 1405 and the substrate 1401 are bonded to each other with the bonding layer 1403. Further, the formation substrate 1505 is separated, and the exposed insulating layer 1455 and the substrate 1303 are bonded to each other with the bonding layer 1305. Although the substrate 1303 does not overlap with the conductive layer 1357 in FIG. 16A, the substrate 1303 may overlap with the conductive layer 1357.

Here, the substrate 1401 corresponds to the first support body 41 described in Embodiment 3, and the substrate 1303 corresponds to the second support body 42.

The steps of separating the formation substrate 1501, bonding the substrate 1401, separating the formation substrate 1505, and bonding the substrate 1303 can be performed using the stack body manufacturing apparatus described in Embodiment 2 or 3.

Note that in the separation step using the stack body manufacturing apparatus in one embodiment of the present invention, the formation substrate can be subjected to any of a variety of separation methods. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release nitrogen, oxygen, or hydrogen contained in the separation layer as a gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

Further, the separation process can be conducted easily by combination of the above-described separation methods. In other words, separation can be performed with physical force (by a machine or the like) after performing laser light irradiation, etching on the separation layer with a gas, a solution, or the like, or mechanical removal with a sharp knife, a scalpel, or the like so that the separation layer and the layer to be separated can be easily separated from each other. This step corresponds to the step of forming a separation trigger in this specification. The separation triggers are preferably formed in each of the process member and the stack body which are processed with the stack body manufacturing apparatus in one embodiment of the present invention.

Separation of the layer to be separated from the formation substrate may be carried out by filling the interface between the separation layer and the layer to be separated with a liquid. Further, the separation may be conducted while pouring a liquid such as water.

As another separation method, in the case where the separation layer is formed using tungsten, it is preferable that the separation be performed while etching the separation layer using a mixed solution of ammonia water and a hydrogen peroxide solution.

Note that the separation layer is not necessary in the case where separation at the interface between the formation substrate and the layer to be separated is possible. For example, glass is used as the formation substrate, an organic resin such as polyimide is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated. In that case, the organic resin can be used as a substrate of the light-emitting device or the like. Furthermore, the organic resin and another substrate may be bonded to each other with an adhesive.

Figure 16A:
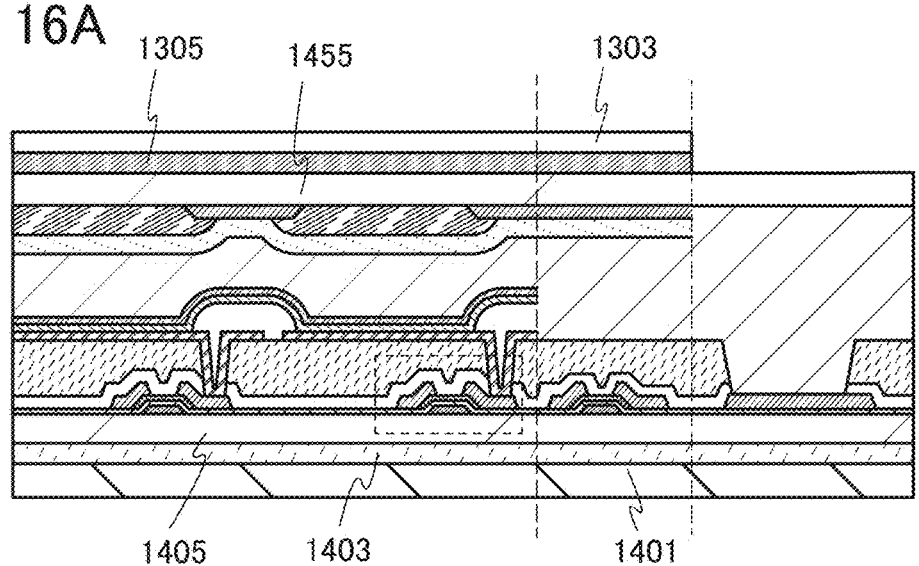
FIGS. 16A to 16C illustrate a method for manufacturing a light-emitting device.
Figure 16B:
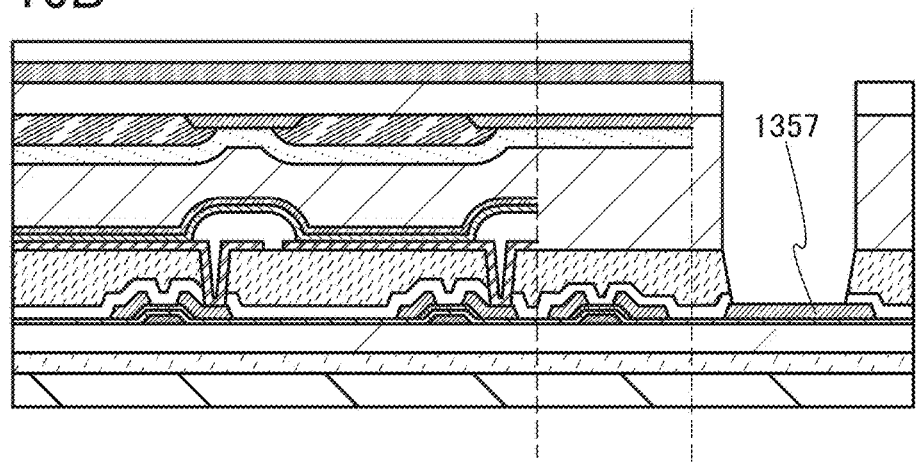
Figure 16C:
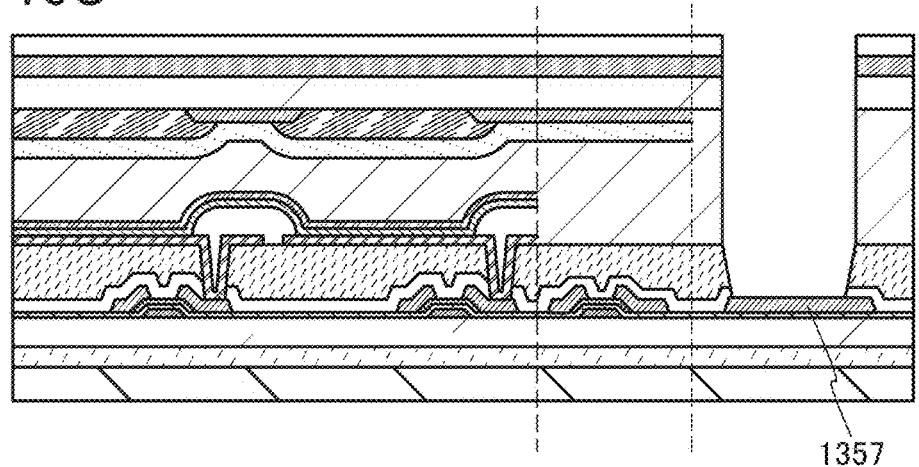

Lastly, an opening is formed in the insulating layer 1455 and the sealing layer 1413 to expose the conductive layer 1357 (FIG. 16B). In the case where the substrate 1303 overlaps with the conductive layer 1357, the opening is formed also in the substrate 1303 and the bonding layer 1305 (FIG. 16C). The mechanism for forming the opening is not particularly limited and may be, for example, a laser ablation method, an etching method, an ion beam sputtering method, or the like. As another method, a cut may be made in a film over the conductive layer 1357 with a sharp knife or the like and part of the film may be separated by physical force.

In the above-described manner, the light-emitting device can be manufactured.

Figure 21:
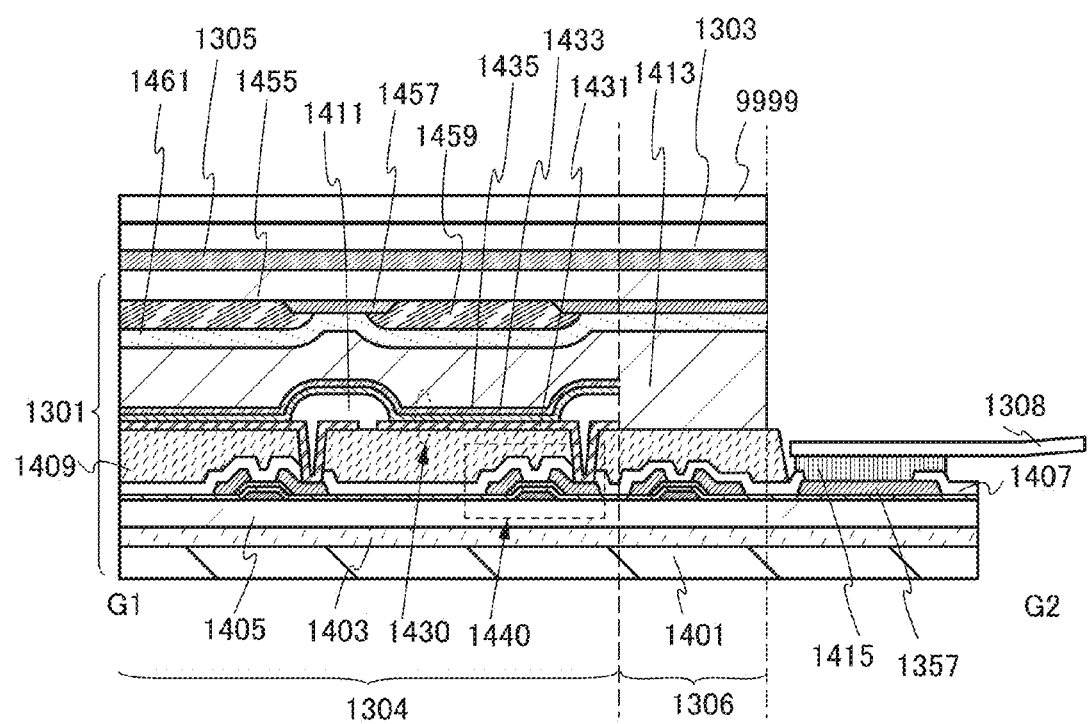
FIG. 21 illustrates a light-emitting device.

Note that a touch sensor or a touch panel may be provided. For example, FIG. 21 illustrates a case where a touch panel 9999 is provided in the light-emitting device in FIGS. 13A and 13B. A touch sensor may be directly formed on the substrate 1303; alternatively, the touch panel 9999 formed on another substrate may be placed over the substrate 1303.

Note that an example of manufacturing a light-emitting device in accordance with one embodiment of the present invention is described in this embodiment; however, one embodiment of the present invention is not limited to this example. For example, in this specification and the like, a display element, a display device which is a device including a display element, a light-emitting element, and a light-emitting device which is a device including a light-emitting element can employ various modes or can include various elements. Examples of light-emitting elements, display devices, light-emitting elements, and light-emitting devices include an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD), an electrowetting element, a piezoelectric ceramic display, or a carbon nanotube, which are display media whose contrast, luminance, reflectivity, transmittance, or the like is changed by electromagnetic action. Examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples further include a display device including electronic ink or electrophoretic elements, such as electronic paper.

In this specification and the like, an active matrix method in which an active element (a non-linear element) is included in a pixel or a passive matrix method in which an active element is not included in a pixel can be used.

In the active matrix method, as an active element, not only a transistor but also a variety of active elements can be used. For example, an MIM (metal insulator metal), a TFD (thin film diode), or the like can also be used. Since these elements can be formed with a smaller number of manufacturing steps, manufacturing cost can be reduced or yield can be improved. Furthermore, since the size of these elements is small, the aperture ratio can be improved, so that power consumption can be reduced or higher luminance can be achieved.

Since an active element is not used in the passive matrix method, the number of manufacturing steps is small, so that manufacturing cost can be reduced or yield can be improved. Furthermore, since an active element is not used, the aperture ratio can be improved, so that power consumption can be reduced or higher luminance can be achieved, for example.

As examples of electronic devices including a display device with flexibility, the following can be given: television devices, monitors of computers or the like, digital cameras, digital video cameras, digital photo frames, cellular phones, portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 22A:
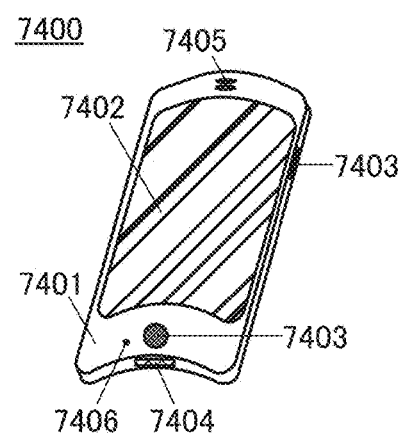
FIGS. 22A to 22F illustrate electronic devices and lighting devices.

FIG. 22A illustrates an example of a cellular phone. A cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using a display device in the display portion 7402.

When the display portion 7402 of the cellular phone 7400 illustrated in FIG. 22A is touched with a finger or the like, data can be input to the cellular phone 7400. Further, operations such as making a call and inputting a character can be performed by touch on the display portion 7402 with a finger or the like.

The power can be turned on or off with the operation button 7403. In addition, types of images displayed on the display portion 7402 can be switched; for example, switching images from a mail creation screen to a main menu screen is performed with the operation button 7403.

Here, the display portion 7402 includes a display device which can be formed using one embodiment of the present invention. Thus, the cellular phone can have a curved display portion and high reliability.

Figure 22B:
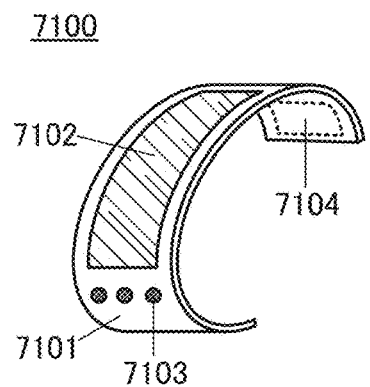

FIG. 22B illustrates an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes a display device which can be formed using one embodiment of the present invention. Thus, the portable display device can have a curved display portion and high reliability.

Figure 22C:
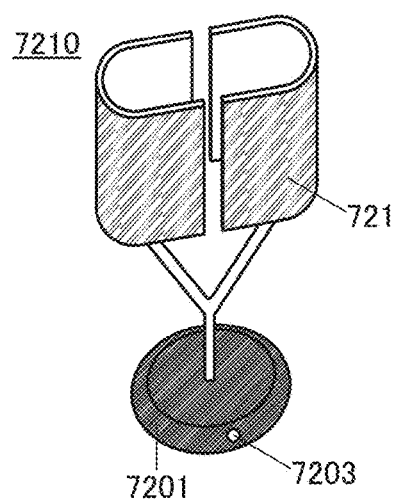
Figure 22D:
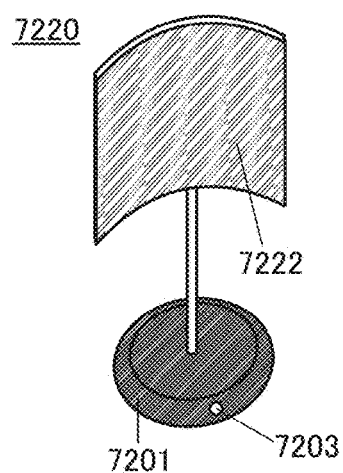

FIGS. 22C and 22D illustrate examples of lighting devices. Lighting devices 7210 and 7220 each include a stage 7201 provided with an operation switch 7203 and a light-emitting portion supported by the stage 7201.

A light-emitting portion 7212 included in the lighting device 7210 illustrated in FIG. 22C has two convex-curved light-emitting portions symmetrically placed. Thus, light radiates from the lighting device 7210.

The lighting device 7220 illustrated in FIG. 22D includes a concave-curved light-emitting portion 7222. This is suitable for illuminating a specific range because light emitted from the light-emitting portion 7222 is collected to the front of the lighting device 7220.

The light-emitting portion included in each of the lighting devices 7210 and 7220 is flexible; thus, the light-emitting portion may be fixed on a plastic member, a movable frame, or the like so that an emission surface of the light-emitting portion can be bent freely depending on the intended use.

The light-emitting portions included in the lighting devices 7210 and 7220 each include a display device which can be formed using one embodiment of the present invention. Thus, the lighting devices can have curved display portions and high reliability.

Figure 22E:
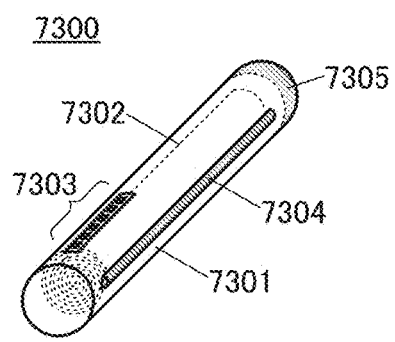

FIG. 22E illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301. The display portion 7302 includes a first substrate provided with a light-blocking layer and the like and a second substrate provided with a transistor and the like. The display portion 7302 is rolled so that the second substrate is positioned on the outer side in the housing 7301.

The display device 7300 can receive a video signal with the control portion 7305 and can display the received video on the display portion 7302. In addition, a battery is included in the control portion 7305. Moreover, a connector may be included in the control portion 7305 so that a video signal or power can be supplied directly.

With the operation buttons 7303, power ON/OFF, switching of displayed videos, and the like can be performed.

Figure 22F:
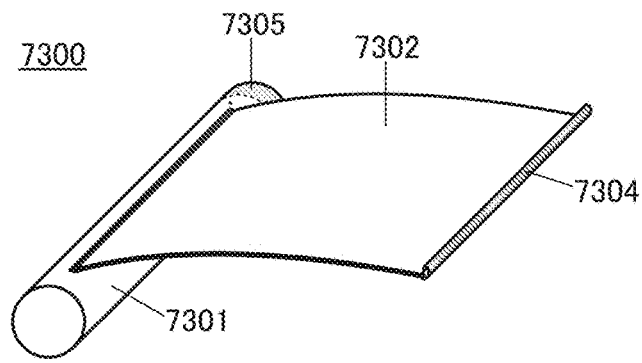

FIG. 22F illustrates a state in which the display portion 7302 is pulled out with the display portion pull 7304. Videos can be displayed on the display portion 7302 in this state. Further, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes a display device which can be formed using one embodiment of the present invention. Thus, the display portion 7302 is a flexible, highly reliable display device, which makes the display device 7300 lightweight and highly reliable.

It is needless to say that one embodiment of the present invention is not limited to the above-described electronic devices and lighting devices as long as the display device which can be formed using one embodiment of the present invention is included.

This embodiment can be combined with any of the other embodiments in this specification as appropriate.

EXPLANATION OF REFERENCE

11: first substrate, 12: first separation layer, 13: first layer to be separated, 13s: separation trigger. 21: second substrate, 22: second separation layer, 23: second layer to be separated, 25: base, 30: bonding layer, 31: first bonding layer, 32: second bonding layer, 41: first support body, 41b: first support body, 42: second support body, 80: process member, 80a: first remaining portion, 80b: one surface layer, 81: stack body, 90: process member, 90a: first remaining portion, 90b: one surface layer, 91: stack body, 91a: second remaining portion, 91b: one surface layer, 91s: separation trigger, 92: stack body, 100: first supply unit, 111: transport mechanism, 112: transport mechanism, 200: apparatus, 201: stage, 201a: inner part, 201b: outer part, 203: member, 205: bonding layer, 207: member, 209: pressurizing mechanism, 211: region, 212: bonding layer formation mechanism, 213: fixing mechanism, 214: fixing mechanism, 215: member holding mechanism, 217: camera, 218: spacer, 219: suction hole, 221: stage, 250: stack body, 300: first separation unit, 300*b*: first storage portion, 350: first cleaning device, 400: first bonding unit, 500: support body supply unit, 600: second supply unit, 700: trigger formation unit, 800: second separation unit, 800*b*: second storage portion, 850: second cleaning device, 900: second bonding unit, 1000: stack body manufacturing apparatus, 1000A: stack body manufacturing apparatus, 1301: element layer, 1303: substrate, 1304: light extraction portion, 1305: bonding layer, 1306: driver circuit portion, 1308: FPC, 1357: conductive layer, 1401: substrate, 1402: substrate, 1403: insulating layer, 1405: insulating layer, 1407: insulating layer, 1408: conductive layer, 1409: insulating layer, 1409*a*: insulating layer, 1409*b*: insulating layer, 1411: insulating layer, 1412: conductive layer, 1413: sealing layer, 1415: connector, 1430: light-emitting element, 1431: lower electrode, 1433: EL layer, 1433*a*: EL layer, 1433*b*: EL layer, 1435: upper electrode, 1440: transistor, 1455: insulating layer, 1457: light-blocking layer, 1459: coloring layer, 1461: insulating layer, 1501: formation substrate, 1503: separation layer, 1505: formation substrate, 1507: separation layer, 1510*a*: conductive layer, 1510*b*: conductive layer, 7100: portable display device, 7101: housing, 7102: display portion, 7103: operation button, 7104: sending and receiving device, 7201: stage, 7203: operation switch, 7210: lighting device, 7212: light-emitting portion, 7220: lighting device, 7222: light-emitting portion, 7300: display device, 7301: housing, 7302: display portion, 7303: operation button, 7304: display portion pull, 7305: control portion, 7400: cellular phone, 7401: housing, 7402: display portion, 7403: operation button, 7404: external connection port, 7405: speaker, 7406: microphone, and 9999: touch panel.

This application is based on Japanese Patent Application serial no. 2013-184659 filed with Japan Patent Office on Sep. 6, 2013 and Japanese Patent Application serial no. 2014-029754 filed with Japan Patent Office on Feb. 19, 2014, the entire contents of which are hereby incorporated by reference.

The invention claimed is:

1. A bonding apparatus comprising:
a stage configured to support a first member;
a fixing mechanism configured to fix one end portion of a second member so that the second member overlaps with the first member; and
a pressurizing mechanism configured to move over the second member from side to side and to spread a bonding layer under pressure between the first member and the second member so that the first member and the second member are bonded to each other with the bonding layer therebetween,
wherein the fixing mechanism comprises a spacer configured to reduce a difference in height between a first region of the second member which overlaps with the fixing mechanism and a second region of the second member which overlaps with the bonding layer to smaller than a sum of thicknesses of the first member and the bonding layer,
wherein the one end portion of the second member is fixed between the fixing mechanism and the spacer, and
wherein the fixing mechanism and the spacer are configured to hold the second member when the pressurizing mechanism is moving.

2. The bonding apparatus according to claim 1, wherein each of the first member and the second member has a sheet-like shape.

3. The bonding apparatus according to claim 1, further comprising:
a bonding layer formation mechanism configured to form the bonding layer over the first member supported by the stage.

4. The bonding apparatus according to claim 1, further comprising:
a member holding mechanism configured to hold the other end portion of the second member so as to prevent the other end portion of the second member from being bonded to the first member, before the first member and the second member are bonded to each other using the pressurizing mechanism.

5. The bonding apparatus according to claim 1, wherein the fixing mechanism is configured to fix the one end portion of the second member at a position which does not overlap with the first member.

6. A bonding apparatus comprising:
a stage configured to support a first member;
a fixing mechanism configured to fix one end portion of a second member so that the second member overlaps with the first member; and
a pressurizing mechanism configured to move over the second member from side to side and to spread a bonding layer under pressure between the first member and the second member so that the first member and the second member are bonded to each other with the bonding layer therebetween,
wherein the fixing mechanism comprises a spacer,
wherein the one end portion of the second member is fixed between the fixing mechanism and the spacer, and
wherein the fixing mechanism and the spacer are configured to hold the second member when the pressurizing mechanism is moving.

7. The bonding apparatus according to claim 6, wherein each of the first member and the second member has a sheet-like shape.

8. The bonding apparatus according to claim 6, further comprising:
a bonding layer formation mechanism configured to form the bonding layer over the first member supported by the stage.

9. The bonding apparatus according to claim 6, further comprising:
a member holding mechanism configured to hold the other end portion of the second member so as to prevent the other end portion of the second member from being bonded to the first member, before the first member and the second member are bonded to each other using the pressurizing mechanism.

10. The bonding apparatus according to claim 6, wherein the fixing mechanism is configured to fix the one end portion of the second member at a position which does not overlap with the first member.

11. The bonding apparatus according to claim 6, wherein the spacer is configured to reduce a difference in height between a first region of the second member which overlaps with the fixing mechanism and a second region of the second member which overlaps with the bonding layer to smaller than a sum of thicknesses of the first member and the bonding layer.

* * * * *